United States Patent [19]

Doggett et al.

[11] Patent Number: 5,274,401
[45] Date of Patent: Dec. 28, 1993

[54] ELECTROSTATIC PRINTHEAD

[75] Inventors: David E. Doggett, Boulder Creek; Brian J. Dahlquist, Palo Alto; Gordon S. Mitchard, Monte Sereno, all of Calif.

[73] Assignee: Synergy Computer Graphics Corporation, Santa Clara, Calif.

[21] Appl. No.: 896,504

[22] Filed: Jun. 1, 1992

Related U.S. Application Data

[63] Continuation of Ser. No. 731,294, Jul. 16, 1991, abandoned, which is a continuation of Ser. No. 516,007, Apr. 27, 1990, abandoned.

[51] Int. Cl.$^5$ .................. G01D 15/06; G01D 15/10
[52] U.S. Cl. ............................ 346/155; 346/76 PH
[58] Field of Search .............. 346/155, 76 PH, 139 C

[56] References Cited

U.S. PATENT DOCUMENTS

| | | | |
|---|---|---|---|
| 3,955,204 | 5/1976 | Anton | 346/139 C |
| 3,979,758 | 9/1976 | Kilby et al. | 346/155 |
| 4,287,525 | 9/1981 | Tagawa | 346/155 |
| 4,415,403 | 11/1983 | Bakewell | 346/155 X |
| 4,534,814 | 8/1985 | Volpe et al. | 346/155 X |
| 4,588,997 | 5/1986 | Tuan et al. | 346/76 PH |
| 4,764,659 | 8/1988 | Minami et al. | 346/76 PH |

*Primary Examiner*—George H. Miller, Jr.
*Attorney, Agent, or Firm*—Skjerven, Morrill, MacPherson, Franklin & Friel

[57] ABSTRACT

In a printhead for electrostatic printers, the styli of the printhead are formed on a monolithic substrate, such as a printed circuit board. Each stylus has its own driver circuit incorporated into one or more integrated circuit die which are mounted directly on the monolithic substrate, and electrically connected to traces formed on the printed circuit board. The styli are the ends of the traces as formed on the edge of the substrate. The integrated circuit die are connected to the traces by wire bonding or TAB bonding. The printhead is implemented in monoscan, biscan, triscan, and various other configurations.

28 Claims, 23 Drawing Sheets

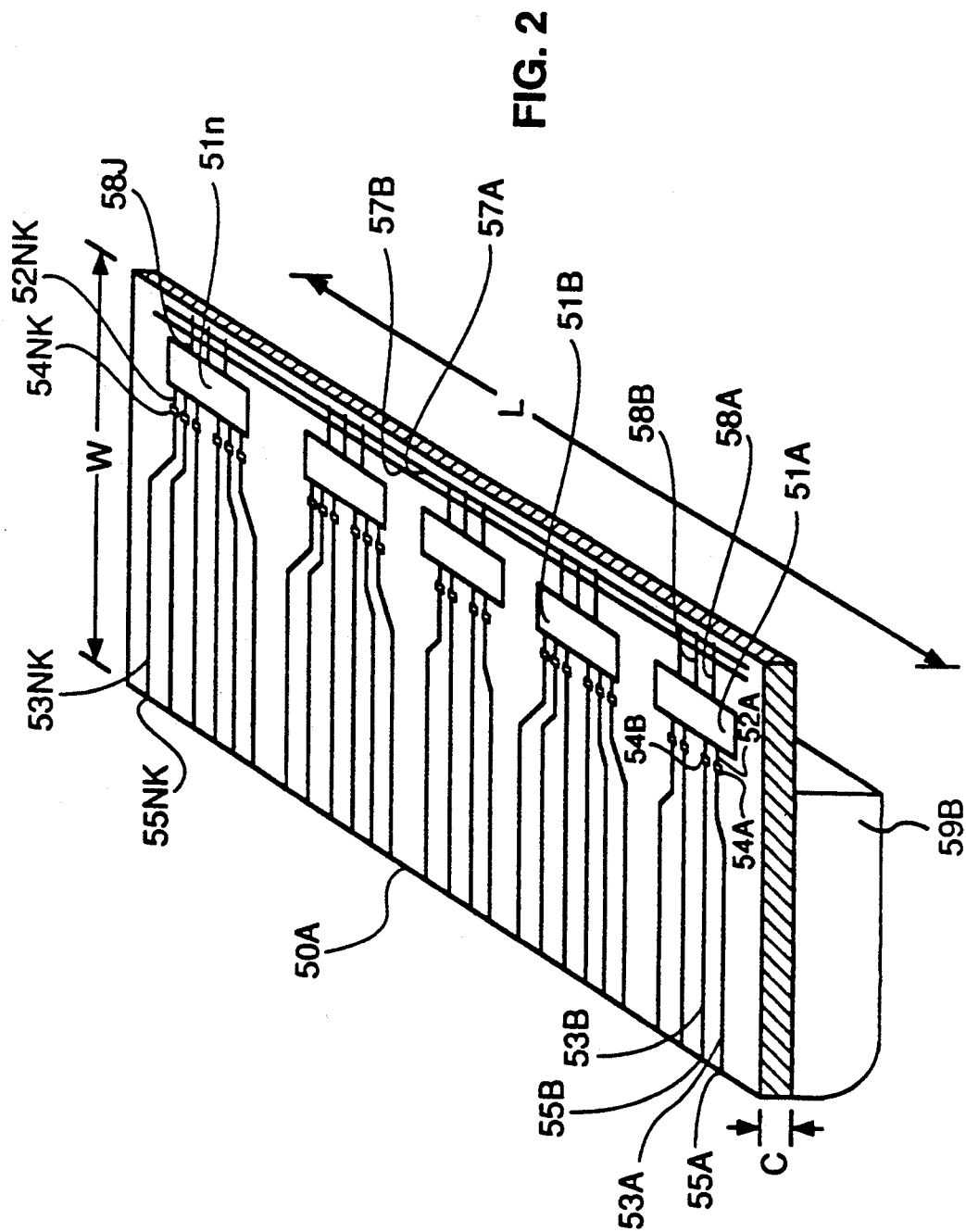

FIG. 5(b)

- ■ O1
- ■ O2      ■ DATA IN/OUT
- ■ O3
- ■ O4      ■ DIR
- ■ O5
- ■ O6
- ■ O7      ■ NCTL
- ■ O8
- ■ O9
- ■ O10     ■ PCTL
- ■ O11
- ■ O12     ■ VDD
- ■ O13
- ■ O14
- ■ O15     ■ LE
- ■ O16
- ■ O17
- ■ O18     ■ CLK
- ■ O19
- ■ O20     ■ BLK
- ■ O21
- ■ O22
- ■ O23     ■ D
- ■ O24
- ■ O25
- ■ O26     ■ VPP (-250)
- ■ O27
- ■ O28
- ■ O29     ■ GND (-500)
- ■ O30
- ■ O31     ■ DATA IN/OUT
- ■ O32

ELECTROSTATIC PRINTHEAD

This application is a continuation of application Ser. No. 07/731,294, filed Jul. 16, 1991, now abandoned which is a continuation of application Ser. No. 07/516,007 filed Apr. 27, 1990, now abandoned.

BACKGROUND OF THE INVENTION

1. Field of the Invention

This invention relates to high voltage electrostatic printers used for printing high definition graphics and more particularly to a unique electrostatic print head with the driver circuitry incorporated in the print head close to the styli, and to the method used to manufacture such a printhead.

2. Description of the Prior Art

In high voltage electrography an electrode stylus, see FIG. 1(a)) is positioned in a spaced apart relationship, a selected distance (typically 7 to 10 microns) from the exposed surface of a dielectric coating 12C of a print medium 12. When a sufficient voltage V (for example, 600 volts) is impressed between electrode 10 and media 12, an electrical breakdown of the air in gap 11 will occur and charge will flow across gap 11 and deposit on the surface of dielectric coating 12C of medium 12. Medium 12 typically consists of a dielectric layer 12C located on the surface of a conductive layer 12B (not necessarily present) which in turn is formed on the base layer 12A. Base layer 12A can be any material on which a print is to be formed such as paper or polyester film for example, and may or may not be electrically conductive.

FIG. 1(b) depicts a typical prior art printhead 20 with styli 21-1 through 21-k through 21-K (where K is a selected integer representing the total number of wires in sheet 22 and k is an integer given by $1 \leq k \leq K$), wire sheet 22 (with the ends of the wires 27-1 to 27-K in wire sheet 22 forming the styli 21-1 through 21-K), support block 23 surrounding and holding styli 21-1 to 21-K, and support plates 24a, 24b fixed to, supporting and holding block 23. An end surface 23a is formed by polishing the assembly to form the finished recording head with the ends of the wires 27-1 through 27-K exposed, forming styli 21-1 through 21-K. Wire sheet 22 (typically composed of thousands of parallel wires) is sectioned into m groups (such as group 25) of N wires each (where N is a selected integer shown in FIG. 2 as ten (10) but more typically a larger number such as 64, 128, 256, or 512) for connection to multiplexing circuitry (not shown). Such multiplexing circuitry is described in U.S. Pat. No. 3,653,065 issued to Brown. To print, medium 26, on which images are to be formed, is moved as shown past end surface 23a of printhead 20 such that medium 26 is kept in a spaced apart relationship to end surface 23a as described before.

Where coloration is desired on print medium 26 at a particular location, the stylus opposite this location is energized to a high voltage and charge is deposited on layer 12C of print medium 26. This charge image is subsequently toned in a manner well known in the art to produce the desired coloration.

The width of gap 11 (see FIG. 1(a)) between stylus 10 (which is the end 21-k of one of the wires 27-k in wire sheet 22) and dielectric 12C is typically maintained by the surface roughness of the medium 12, although spacing can be accomplished through the use of spacer particles as taught in U.S. Pat. No. 3,711,859, issued to Brown, et al. The spatial distribution of the charge deposited on the surface of dielectric 12C approximates the shape but typically is larger than the exact cross-sectional area of the tip of stylus 10. A stylus with a circular cross-section thus forms a round area of charge distribution which becomes a round printed dot upon subsequent toning, while a stylus with a rectangular cross-section will tend to form a rectangular printed dot upon toning of dielectric layer 12C.

To control this charge deposition, a high voltage switch 14 (FIG. 1(a)) is provided between stylus 10 and voltage source 15. Another switch 16 is provided between conductive multiplexing counter electrode 13 and a second voltage source 17 of opposite polarity to voltage source 15. If each voltage source delivers approximately one half the required voltage to effect printing then switch 14 and switch 16 (typically high voltage transistors) must be turned on simultaneously to deposit charge on medium 12. If either switch 14 or switch 16 is left open, charge is not deposited.

The above described multiplex printing method can be avoided if a high voltage switch is supplied to each wire 27-1 through 27K (FIG. 1(b)) and a voltage is supplied to each switch that is independently capable of effecting printing so that the voltage of each stylus end 21-1 through 21-K is independently controlled. In an electrostatic printer using one switching transistor for each stylus the number of switching transistors is equal to the number of styli and can become very large for print heads that are long or for print heads that have many styli per unit lengths. If individual transistors are used in such a printhead the printhead can become very expensive. A typical printhead used in electrostatic printers of the prior art is 36 inches (90 centimeters) long and uses 14,400 styli (K=14,400), spaced 400 styli per inch, to achieve a resolution of 400 dots per inch. Thus, 14,400 high voltage transistors would be required; this could be prohibitively expensive. Accordingly, in the prior art, a single switching transistor has been connected to a plurality of styli in the printing head to reduce the number of switching transistors required. In the prior art, a corresponding plurality of multiplexing counter electrodes (not shown) has also been provided, each such counter electrode being adjacent a selected number of styli 21-k, . . . , 21-(k+N), where N is as previously defined. Each counter electrode is energized in sequence so that a line of selected charge deposition is formed on the print medium only when all the counter electrodes have been sequentially energized. Each styli switching transistor 14 (see FIG. 1(a)) connects one voltage source 15 to a plurality of styli but only one of the plurality of styli is adjacent any particular counter electrode 13. Thus a given styli switching transistor, when turned on, applies a voltage to all styli connected to it but only the single stylus 10 adjacent the counter electrode 13, which is energized, has a sufficient voltage difference between it and the media to enable the air in gap 11 to break down and conduct such that stylus 10 applies a charge to the adjacent medium 12. Any or all styli switching transistors 14 are capable of being activated each time a single counter electrode 13 is activated by turning on counter electrode switching transistor 16.

Multiplexing of the type described above is made possible by the fact that only a very short time (typically less than 100 microseconds) is required to place enough charge on medium 12 such that the resultant toned image will possess sufficient optical density.

While short printing pulses are possible, such a system places requirements on the conductivity of the print media layers 12A and 12B that narrows its operating environmental range, and increases the cost of the media.

In the structure and method described above, a portion of the voltage required to print on medium 12 is applied to base layer 12A by a sliding ohmic contact referred to earlier as counter electrode 13. The other portion of the required voltage is applied to stylus 10 which is a short distance from dielectric 12C so that the resultant electric field across medium 12 is about 600 volts which is sufficient to cause printing.

Other multiplexing systems utilize capacitive coupling through the dielectric layer 12C and into the conductive layers 12A or 12B in order to provide that portion of the voltage that would normally be supplied by the voltage on electrode 13 by ohmic connection to the base layer 12A. In this configuration (see FIG. 1(c)) the counter electrodes 13A and 13B are mounted adjacent to the styli. Multiplexing still functions in exactly the same manner as described above. This prior art is illustrated in U.S. Pat. No. 4,271,417 to Blumenthal et al., U.S. Pat. No. 3,653,065 to Brown, and U.S. Pat. No. 3,979,760 to Taduchi.

The systems as described above are difficult to fabricate because such styli arrays have 14,400 wires for a 36 inch head that has a resolution of 400 dots per inch. The prior art multiplexed printheads (see FIG. 1(b)) are typically fabricated from wires 27-1 to 27-K surrounded by a cast block of epoxy 23. See U.S. Pat. No. 4,419,679 to Rutherford et al. for a discussion on fabrication of these prior art styli array printheads. See also U.S. Pat. No. 4,131,986 to Esciva et al., U.S. Pat. No. 3,693,185 to Lloyd, and U.S. Pat. No. 3,624,661 to Shebanow and Borelli. Such printheads are often hand wired; it takes a worker up to 80 hours to wire each printhead, so each printhead is quite expensive to manufacture. In a single pass color printer there can be four printheads (sometimes called "charging units") per printer, one charging unit for each color to be printed, thus multiplying the cost.

Those skilled in the art have attempted other approaches to constructing printheads. In one approach, the traces electrically connecting together the styli in each styli group are photolithographically formed on one side of the printed circuit board, and the styli are formed on the other side. See U.S. Pat. No. 4,163,980 to Angelbeck et al. for a description of one embodiment of this approach and U.S. Pat. No. 3,903,594 to Koneval. This approach has been used to make small (eleven inches long) printheads incorporating two stylus arrays with a resolution of 100 dots per inch (dpi). The resulting printhead has a resolution of 200 dpi. Constructing such multiplexed printed circuit printheads is especially difficult because in order to make connections between styli of the different multiplexing groups, very small diameter holes have to be formed in the substrate. In addition, the traces that connect the styli groups generally run parallel for long distances undesirably increasing lead capacitance, and finally the print styli need to be as thick as they are wide.

A result of the above-described prior art is that a plurality of styli in each printhead are electrically connected together (multiplexed). Because of the large number of styli in each group, each styli group has high capacitance, and so requires a high power driver circuit (previously referred to as switching transistors) to bring each stylus in the group up to the desired voltage in the short times allowed as previously discussed. Typically, the driver circuits required to drive the high capacitance printheads have an output current capability of 100 milliamps and must operate at 400 volts to have adequate operating margin.

The use of multiplexing technology introduces a set of printing artifacts that do not occur if the printhead has one high voltage switch connected to each individual stylus. The terms used to describe these prior art artifacts are terms such as "nib (styli) group boundary striations", "ghosting", and "flaring". Nib group boundary striations are undesirable variations in the print density which occur when the printer is printing a large solid area and it is believed are caused by the styli in the center of each multiplexing group competing for charging current with their neighbors. A multiplexing group consists of the styli adjacent one counter electrode, (such as counter electrode 13 in FIG. 1(a)). The styli on the ends of each group have access to a larger reservoir of the charge induced on the substrate by counter electrode 13. The styli in the center of the group must compete with their simultaneously charging neighbors for this finite amount of charge in the conductive layer of the print medium 12. The effect is to provide higher charging currents to styli at the ends of each multiplexing group. Thus there is a higher amount of charge deposited on the print medium by the styli at the ends of each group. This results in, undesirably, printing of a light area on the medium at the center of each styli group and a dark area on the medium at the edges of the group.

Ghosting is caused by energized styli that are not adjacent the energized counter electrode nevertheless discharging to the medium and creating an undesirable charge image on the medium. In this case, the voltage in the print medium supplied by the counter electrode is conducted laterally over a large enough distance to reach nonadjacent, energized styli.

Flaring causes undesirable dot size print variation on the medium and is thought to be associated with high printhead capacitance. Flaring is believed to be an uncontrolled discharge of electrons flowing across the stylus-medium air gap, resulting in charge being deposited on the medium surface in areas other than desired. This dot size print area change results in a color density variation.

The prior art printheads exhibit other deficiencies. Due to the many lateral interconnections on the PCB (printed circuit board) the head extends a large distance below the media (i.e. has a high aspect ratio). The PCB multiplexed head must have many connections to connect the drive transistors to the styli. The electronics for the printheads (i.e. the multiplexing circuitry) is relatively expensive and complex due to the multiplexing feature. Since each printhead is a wire sheet, it is difficult to properly align the thousand of wires in the sheet, and hence the styli.

Various head configurations are known in the art. In configurations known as "monoscan", the styli are in a single row and the styli are necessarily very close together In a high resolution printhead, i.e. 400 dots per inch or more, high voltage is often impressed on one stylus and not on the next stylus, so therefore electric current often arcs from stylus-to-stylus due to the closeness of adjacent styli. Over a period of time, arcing damages or erodes the face of each stylus, affecting print quality negatively because the printed dot size changes as the cross-sectional area of each stylus changes with this erosion.

Therefore, the industry has developed biscan (two rows of styli), triscan (three rows of styli) and quadscan (four rows of styli) print heads, so as to better space apart the styli, with the styli in each row staggered in relation to those in the other rows, so that the rows taken together can print across the width of the printhead with the desired density. This reduces or eliminates the arcing problem. Heads of these types can be seen in U.S. Pat. Nos. 4,419,679 to Rutherford, 4,165,514 to Ishima, 4,163,980 to Angelbeck et al., 4,131,986 to Esciva et al., and 3,958,251 to Borelli.

In a biscan head, conventionally, a time delay is provided electronically between a first set of data which is intended to control the first styli row and a second set of data intended to control the second styli row so that the printed dots in the two rows correctly interleave to form a complete image. Similar types of delays are employed with quadscan print heads. Such a time delay method is termed buffering and requires a type of memory in order to store the bits to be printed until the paper has moved into proper position.

Therefore prior art printheads suffer from the deficiencies of high cost, printing defects, complexity, and the need for expensive media.

SUMMARY OF THE INVENTION

This invention overcomes certain of the above-described problems of the prior art. In accordance with the present invention, one driver circuit is provided for each stylus in an electrostatic printing head. The use of a single driver circuit per stylus allows each stylus to discharge for a relatively long period of time, thus allowing the media parameters to be relaxed and the cost of the media to be reduced The styli are formed on a monolithic substrate, and the driver circuits and their associated logic circuitry are formed as parts of integrated circuit die mounted on the styli substrate, thereby reducing the length of the leads between the driver circuits and the styli and thus reducing the capacitance associated with each lead. Each integrated circuit die is mounted directly on the substrate without use of a conventional integrated circuit package in one embodiment. The styli are formed by well known photolithographic processes on the surface of inexpensive PCB material such as fiber glass epoxy substrate material available from many vendors.

The styli substrate material must provide high electrical resistance to styli that are closely spaced (e.g. on the order of 0.0025 inch between conductive styli traces). Also the styli substrate should not degrade rapidly in the presence of the discharge that occurs when a stylus transfers charge to the print media. Glass epoxy laminate material identified commercially as FR4 and available from several vendors performs adequately.

In accordance with the present invention, the styli are formed at the edge of the insulating substrate and comprise the ends of conductive, spaced apart traces formed on the surface of the substrate. Each stylus is a narrow rectangle in cross-section, formed in one embodiment as described in copending patent application, incorporated herein by reference, Ser. no. 07/345,152, filed Apr. 28, 1989, attorney docket no. M-798, entitled "Electrostatic Printer Head Structure and Styli Geometry." Thus, the traces are relatively wide but thin. This stylus shape, coupled with the long write times permitted by the single driver circuit per stylus, enables printing by sweeping out rectangular (preferably square) dots. This is an improvement over the round dots of the prior art because it provides for a better dynamic range of color as is described in copending patent application Ser. No. 07/345,327, filed Apr. 28, 1989, attorney docket no. M-815 entitled "Single Pixel Gray Level Control in a Color Electrostatic Plotter", incorporated by reference herein.

The conductive trace connecting each stylus to the appropriate integrated circuit is 0.5 inch or less (1.2 cm. or less) to 2 inches (5 cm.) in length. A typical length is one inch (2.5 cm.) or less. This is much shorter than in the prior art and thus substantially reduces the capacitance associated with each stylus. Each driver circuit typically provides a current on the order of one to ten microamps. Because of the low styli current requirement, the drive transistors can be made particularly small. The small device size of the integrated circuit transistors also reduces capacitance. Each driver circuit provides a 250 volt push-pull drive capability in one embodiment, without the need for electronic components other than those in the integrated circuit die.

The present invention therefore provides numerous advantages over the prior art, including:

Reducing the need for high current to the driver transistors, and thus reducing the power supplied to the printhead. The printhead has less capacitance than the prior art device due to the short traces and thus uses less charging current.

Allowing a long pulse length to the styli, since there is no multiplexing of styli, and thus allowing lower voltage on the styli by charging the medium over a longer time, or alternatively allowing higher print speed for a given voltage.

Reducing flaring at the styli tips as a result of lower printhead capacitance.

Improving print quality by eliminating nib group boundary striations.

Permitting use of other than the standard but expensive electrographic print media. With the present invention it is possible, due to the long write times, to reduce the conductivity of the conductive layer in the media, thereby reducing media cost.

Permitting use in a print head of a substrate with traces and styli produced by inexpensive photolithography techniques instead of the expensive prior art wire bundle arrays and conventionally multiplexed printed circuit board printheads.

Eliminating the need for a series of multiplexed counter electrodes by using only one counter electrode for the entire printhead.

Reducing manufacturing cost over the prior art, since the electronics used in the present invention can be integrated circuit semiconductor devices costing very little per driver circuit.

Improving the accuracy of trace location on the substrate.

In accordance with one embodiment of the present invention, an electrostatic printer uses a 36 inch (90 cm) wide printhead having 14,400 print styli together with 14,400 driver circuits. The driver circuits are in integrated circuit (IC) form; each IC includes, for example, sixty-four (or some other convenient number) of driver circuits. Each IC also includes logic and serial-to-parallel converters.

Various head configurations are possible in accordance with the invention as described below.

BRIEF DESCRIPTION OF THE DRAWINGS

FIG. 2 shows a perspective view of one embodiment of the invention.

FIGS. 5(a), 5(b) show pin assignments for integrated circuits of two embodiments of the invention.

Similar reference numerals in various figures denote similar or identical structures.

DETAILED DESCRIPTION OF THE INVENTION

In accordance with the present invention, the printhead (as partially shown for instance in perspective view FIG. 2) is formed on a substrate 50 which is conventional glass epoxy printed circuit board material (such as FR-4) or other similar insulating material known in the art of printed circuit board manufacture.

Electrically conductive traces of which representative traces 53A and 53B are labelled, are formed on substrate 50. Traces such as traces 53A and 53B are of uniform width and are preferably, copper, or alternatively any other appropriate conductive material such as nickel, gold, beryllium, chrome, molybdenum, or aluminum, and are formed onto substrate 50 by well known methods such as photolithography or electroprinting or any other method that can form traces of high quality on a substrate. In the event the traces are photolithographically produced by exposure of a photo resist with subsequent etching, the base metal is placed on the substrate by well known methods such as lamination or by deposition (such as by sputtering or vacuum evaporation) or formed by thick film processes on a ceramic substrate material.

Each IC such as 51A is arranged on substrate 50 and conventionally has input and output pads which are connected to the driver circuits which are formed on IC 51A (not shown). Leads 52 connect the output pads to the conductive traces 53A, 53B, etc., the ends of which form the styli 55A, 55B, etc. Leads 58 connect the input pads to the input signal lines 57A, 57B, etc. Leads 52 and 58 can be formed by any one of a number of conventional bonding techniques such as wire bonding or tape automated bonding (TAB) which is not shown.

Figure 1A:
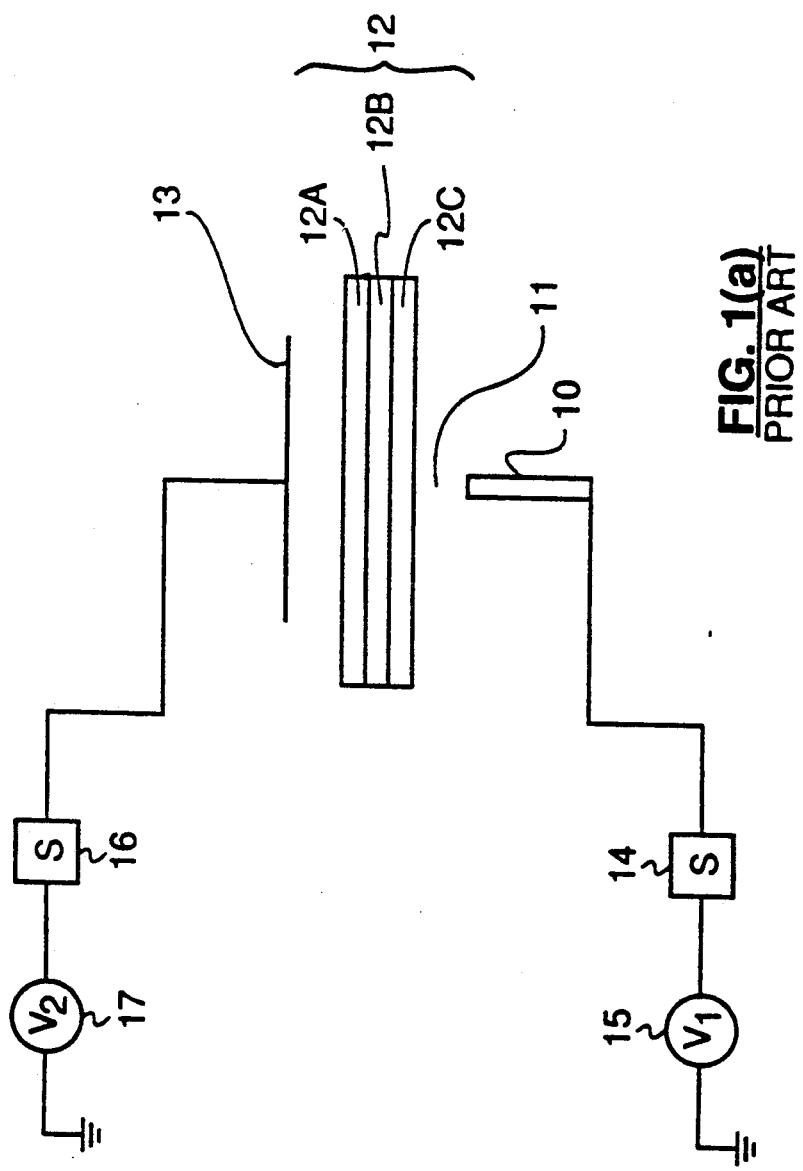
FIGS. 1(a) and 1(c) show the relationship in the prior art of the print medium to the stylus and the counter-electrode.
Figure 1B:
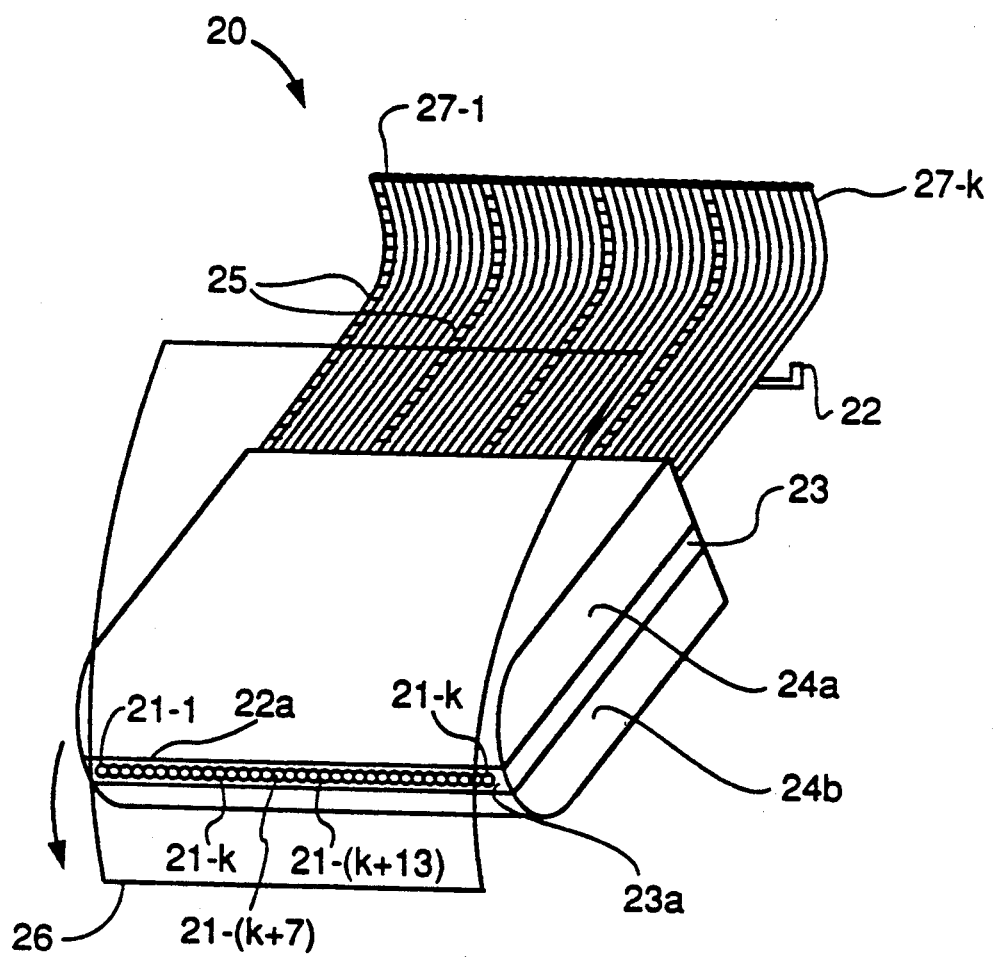
FIG. 1(b) shows a prior art printhead.
Figure 1C:
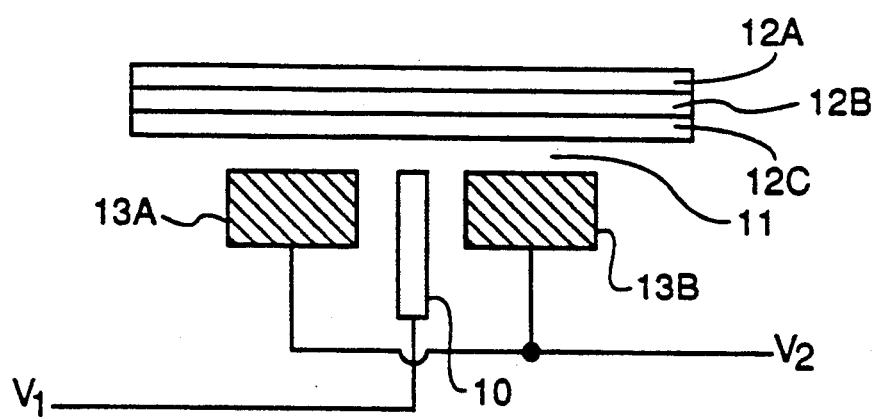
Figure 3A:
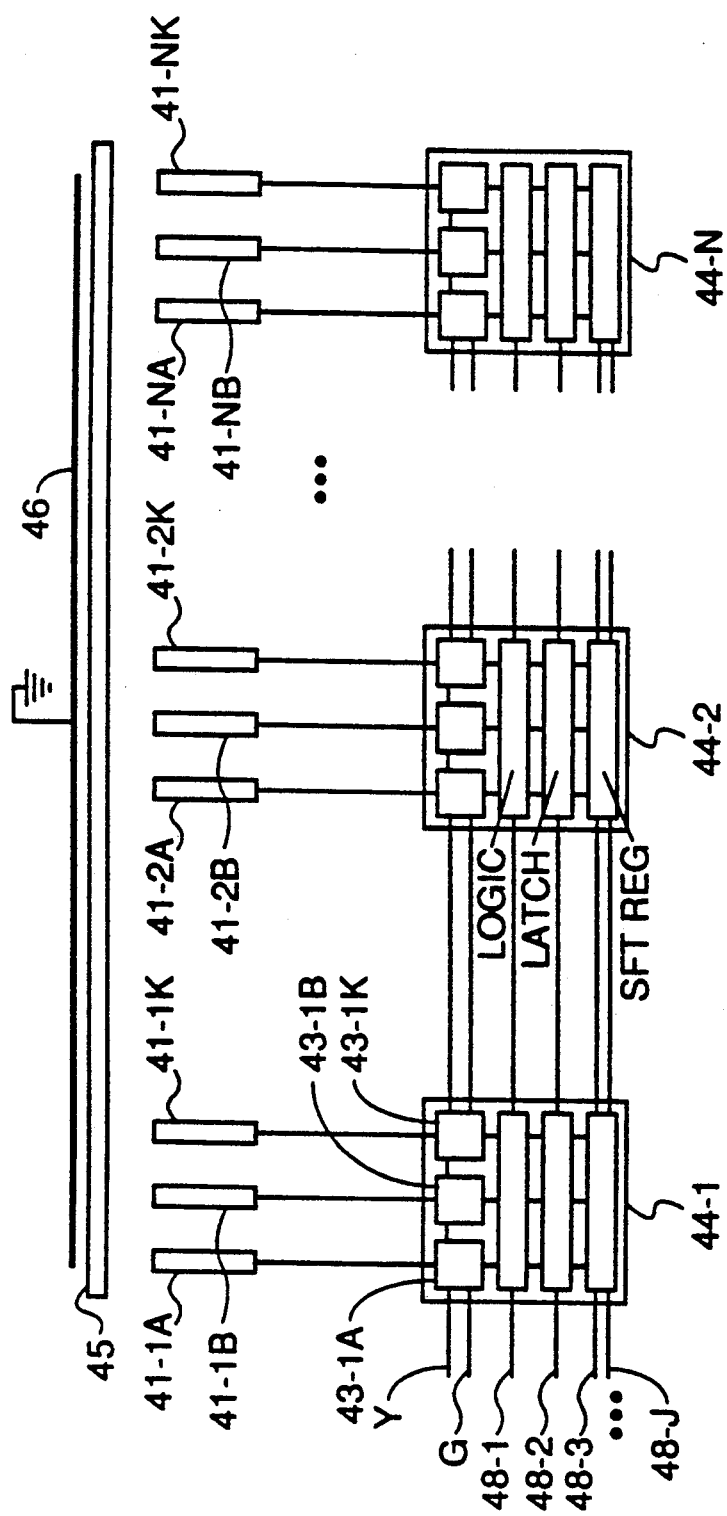
FIGS. 3(a), 3(b) show schematically the circuitry used to activate the styli in a print head.

FIG. 3(a) depicts in schematic form a printhead in accordance with the present invention. Styli 41-1A, 41-1B, . . . ,41-NK are each connected to a corresponding driver circuit 43-1A, 43-1B,. . . ,43-NK (where N is equal to the number of IC's and K is equal to the number of styli per IC) A group of driver circuits such as 43-1A, 43-1B, . . . ,43-1K are grouped into one integrated circuit 44-1. Each driver circuit 43-1A, 43-1B, . . . ,43-NK, is connected to voltage source V, ground source G, and respectively to control lines 48-1, 48-2, . . . ,48-J. Medium 45 is in close proximity with styli 41-1A, 41-1B, . . . ,41-NK as described above. Because each stylus 41-1A through 41-NK is driven by a single uniquely corresponding driver circuit 43-1A through 43-NK which drives only that stylus, a single (non-multiplexed) backplate 46 is provided to electrically ground the back of medium 45, thus providing a return path for the charging current.

Figure 3B:
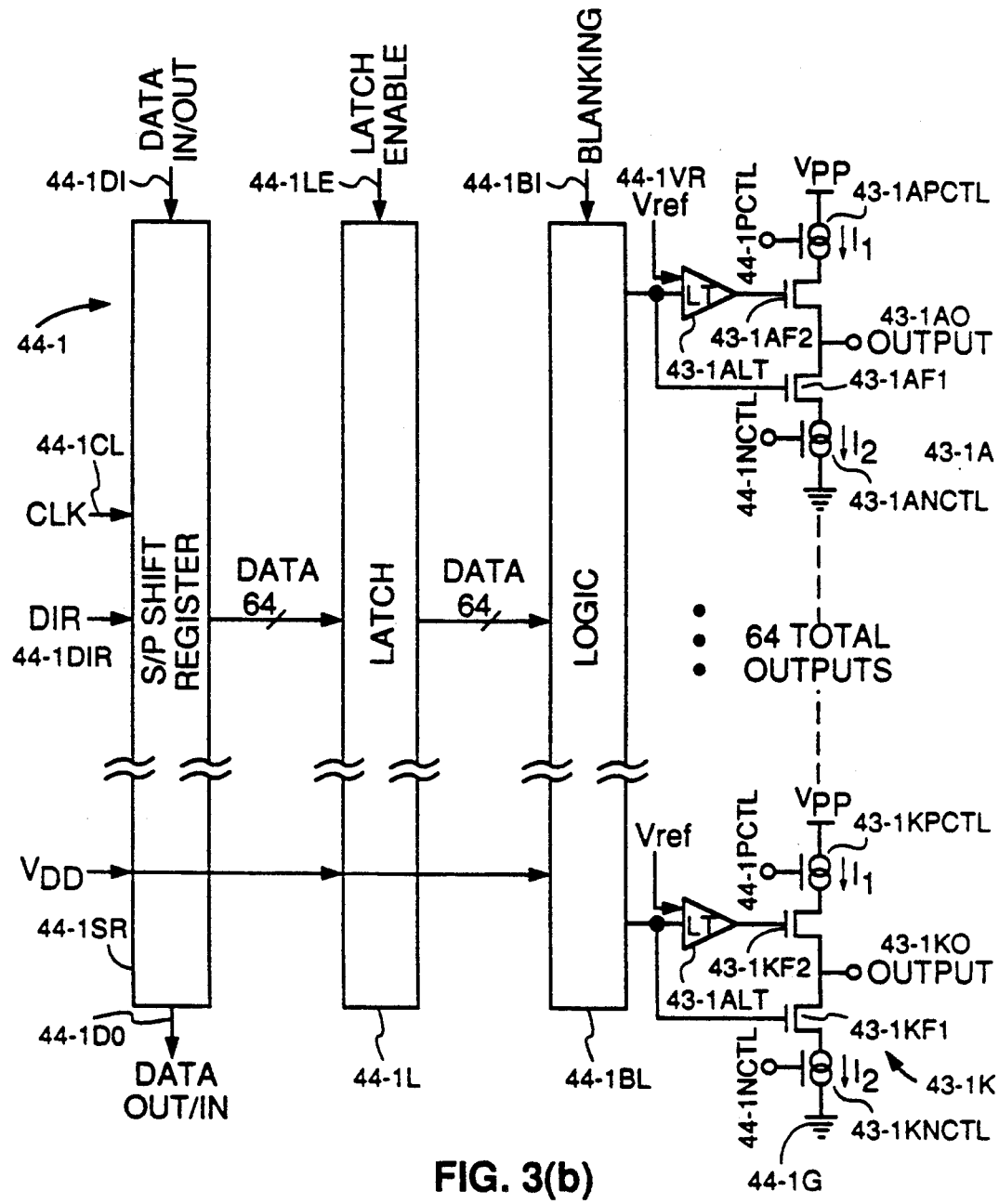

Each IC 44-1 through 44-N of FIG. 3(a) has the structure shown schematically in FIG. 3(b). IC 44-1 is a high voltage device having sixty-four (or some other convenient number K) driver circuits 43-1A, . . . , 43-1K. Each driver circuit such as 43-1A includes preferably two field effect transistors (FETs). One FET 43-1AF1 is an N-channel device; the second FET 43-1AF2 is a P-channel device.

Each driver circuit 43-1A through 43-1K is triggered by an input signal provided to the driver circuit at the serial input line from a graphics data source, not shown (i.e., the controller of the electrographic printer).

Each IC 44-1 through 44-N includes:

1. One serial input/output data line (Data In/Out) 44-1DI The input data bit shift occurs at the high to low transition of the clock (CLK) for all serial to parallel converter shift register 44-1SR stages.

2. One serial output/input data line (Data Out/In) 44-1DO. The output data represents the input data delayed by K (for example 64) cycles and is the output of the bit shift register 44-1SR.

3. One clock input line (CLK) 44-1CL for clocking the data into and out of the serial to parallel converter 44-1SR on the high to low transition of the clock signals.

4. One latch input signal line (Latch Enable, LE) 44-1LE. The Latch Enable positive true is used to parallel load the latch driving the Blanking Logic driver once the correct data has been shifted into the IC 44-1.

5. One blanking input signal line (Blanking, BLK) 4-1B Blanking positive true is used to hold all styli in the no-print state, where the output equals Vpp (see below).

6. One high voltage power line (Vpp) providing about +250 volts relative to the ground line 44-1G and biased at −300 volts relative to chassis ground.

7. One twelve (12) volt power line ($V_{DD}$) (for the logic circuitry) providing +12 volts relative to the ground line, and biased at about −538 volts relative to chassis ground.

8. One ground line (GND) 44-1G, biased at about −550 volts relative to chassis ground.

9. One current control line (PCTL) 44-1PCTL which is the current source control for the output drivers. One current control line (NCTL) 44-1NCTL which is the current sink control for the output drivers. The output current source and sink levels reflect the currents supplied to PCTL and NCTL respectively.

10. One shift register direction line (DIR) 44-1DIR to control the direction of the data flow through the shift register.

11. A number of data output lines (such as 64) 43-1AO, . . . ,43-1KO. Each data output line 43-1AO, . . . ,43-1KO drives a single stylus respectively 41-1A, . . . ,41-1K (see FIG. 3A), so no stylus multiplexing is required. All K styli maintain approximately equal current source and sink values as determined by the PCTL (44-1PCTL) and NCTL 44-1NCTL) signals which drive reference circuits 43-1APCTL, . . . ,43-1KPCTL and 43 1ANCTL, . . . ,43-1KNCTL respectively. Each output line 43-1AO, . . . ,43-1KO is driven to Vpp if the state of the output latch 44-1L is a "zero" and is driven to the ground line voltage if the state of the output latch 44-1L is a "one", when the BLANKING control input (44-1B) is low.

Figure 4:
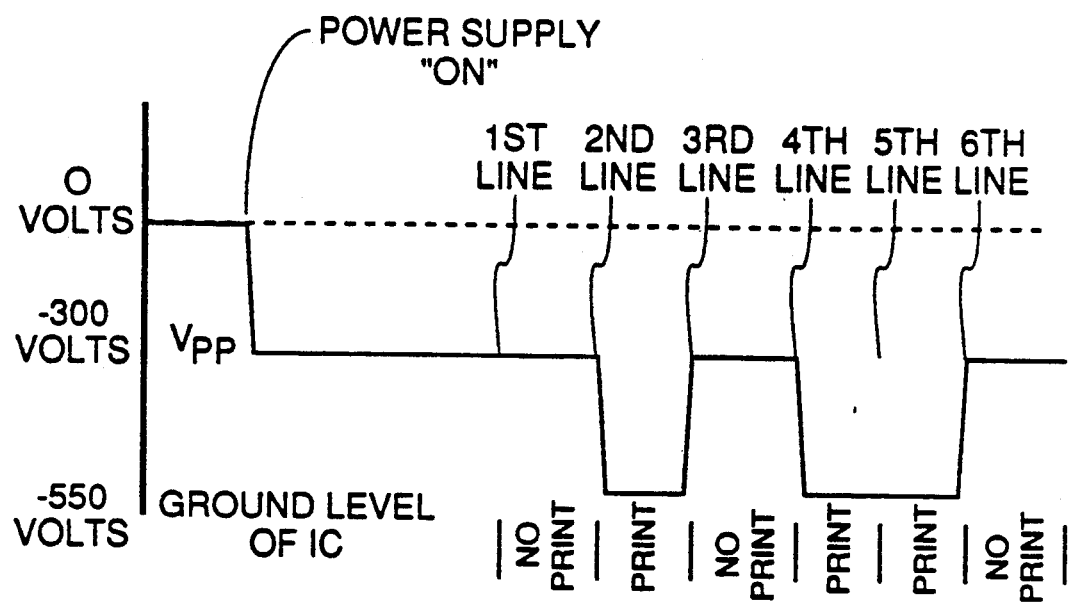
FIG. 4 shows the waveform of the outputs of integrated circuit used in one embodiment of the invention.

FIG. 4 depicts a typical waveform for one data output line such as 43-1AO during printing. Data fed into the IC during the time before printing of the first line determines that 43-1AO will remain at the approximately $-250$ V bias level during the printing of the first line. While the first line is being printed, data is again fed into the IC to ready the logic for the printing of the second line. The data fed into the IC for the second line determines that 43-1AO will shift to the print voltage of approximately $-550$ V during the printing of the second line. The rest of the transitions occur as described above.

The architecture of each IC 44-1 through 44-N is identical and is a low voltage serial to high voltage parallel converter with push-pull output.

The serial to parallel converter shift register 44-1SR (FIG. 3(b)) forms a temporary line buffer. Once the line data is stored in shift register 44-1SR, the line data may be loaded into parallel output latch 44-1L. The transfer of data bits from the shift register to the latch typically occurs at the beginning of the next print line.

Parallel output latch 44-1L holds the value present in shift register 44-1SR for printing by the styli. Latch 44-1L transparently loads whatever value is present at the shift register (44-1SR) output when Latch Enable 44-1LE is high The blanking logic 44-1BL disables all printing by forcing all the styli into the no-print state. The blanking signal 44-1B can be totally asynchronous but is preferably asserted at the end of a printing cycle. Blanking can be used to reduce the length of the printed spot in the direction of paper motion to compensate for spot size growth that is a result of the size of the styli and the voltage placed on the styli. By using blanking before the start of a printed line and at the end of a printed line, the size of the generally rectangular printed spot can be modified.

The IC's 44-1, . . . ,44-N are preferably a custom design from Supertex Inc., Sunnyvale, Calif. Other IC's having circuitry as shown are used in other embodiments.

Figure 5A:
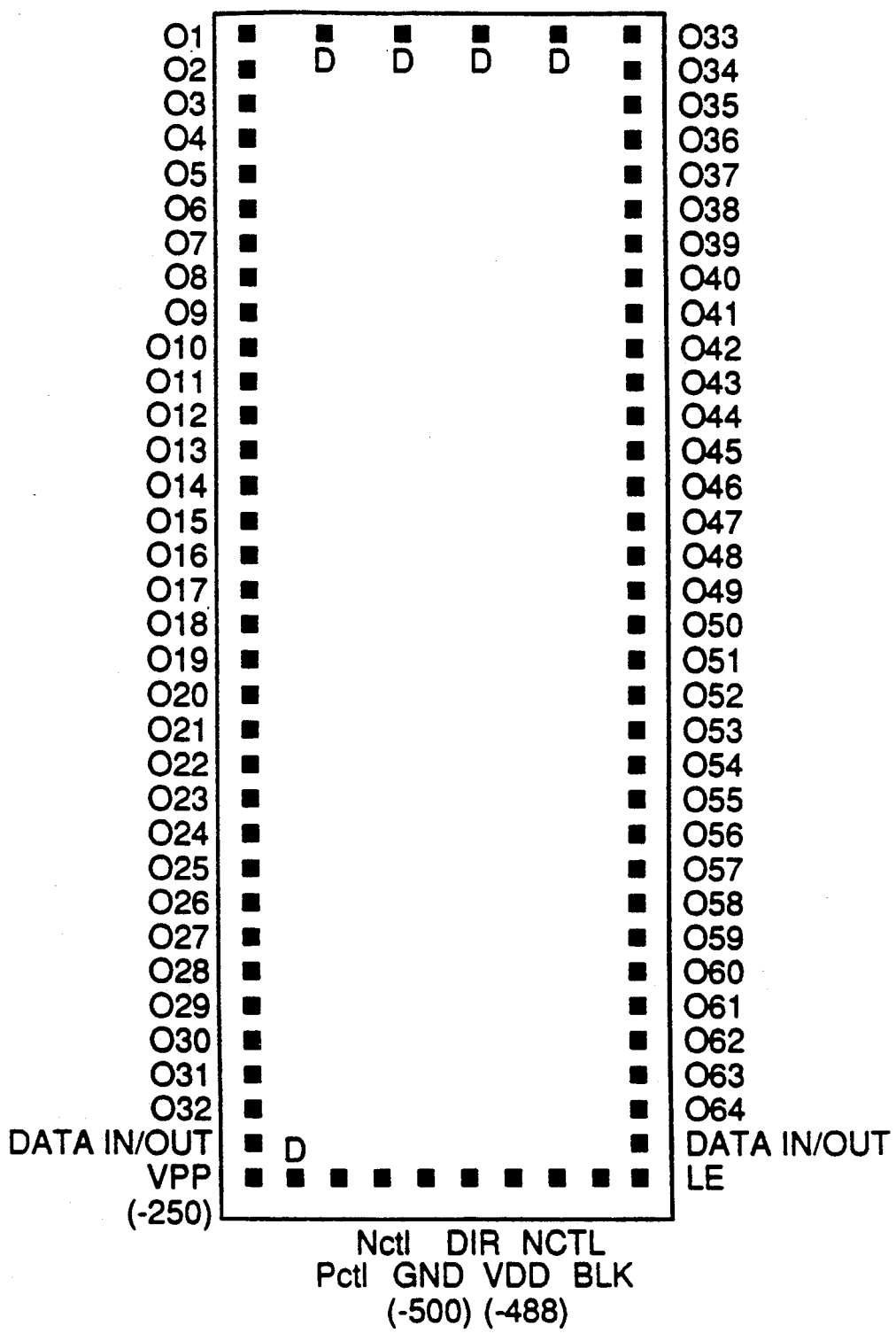

The bonding pad layout for IC's such as 44-1 . . . ,44-N for a sixty-four output line configuration is shown in FIG. 5(a). The stylus output pads are designated 01, 02, . . . ,064. Four dummy pads labeled "D" produce an approximately symmetrical bond pattern for use by interconnection techniques such as TAB.

In another embodiment IC's 44-1, . . . ,44-N each have only 32 stylus output lines. See FIG. 5(b) for the bonding pad layout of this embodiment. The stylus output pads are designated 01, 02, . . . ,032.

For each IC such as 44-1, (see FIG. 3(b)) one shift register direction line (DIR) 44-1DIR is provided to reverse the direction of data movement through shift register 44-1SR in response to clocking signal 44-1CL. This enables the same chip to be used for a monoscan embodiment or either web of a biscan head embodiment as well as any other embodiment. Monoscan and biscan heads are described in detail below. In such a biscan head the two webs are of identical construction but are assembled so that, if data is fed into the same end of the two webs, the flow of data through the IC's will be opposite in direction. When a low signal is provided on direction line (DIR), data is shifted from 43-1A to 43-1K; when DIR is high, data is shifted from 43-1K to 43-1A.

Each driver circuit 43-1A through 43-1K includes two current control circuits 43-1APCTL and 43-1ANCTL through 43-1KPCTL and 43-1KNCTL each consisting of a programmable source and sink respectively. Current source 43-1APCTL, for example, is a current source for the P-channel FET 43-1AF2, and the second current sink 43-1ANCTL is a current sink for the N-channel FET 43-1AF1. These programmable currents are controlled by a reference input PCTL (44-1PCTL) and NCTL (44-1NCTL). The current control circuits consist of a one to one current mirror and an internal series resistance. The current flow through the current mirror and thus the current through 43-1APCTL and 43-1ANCTL, is determined by an external reference voltage divided by the internal resistance. In this manner the output current level of the FETs can be set by varying the external voltage reference. In the case of PCTL this voltage is referenced to the VPP supply and in the case of the NCTL this voltage is referenced to the ground line.

The current sources 43-1APCTL, . . . ,43-1KPCTL are programmed to provide a particular current level to, respectively, P-channel FETs 43-1AF2, . . . ,43-1KF2 by control line 44-1PCTL, to which they are connected in parallel. Similarly, the current sources 43-1ANCTL, . . . ,43-1KNCTL are programmed to provide a particular current level to respectively N-channel FETs 43-1AF1, . . . ,43-1KF1 by control line 44-1NCTL, to which they are connected in parallel. Thus signals on control line 44-1NCTL simultaneously program all current sources 43-1ANCTL, . . . ,43-1KNCTL, and signals on control line 44-1PCTL simultaneously program all current sources 43-1APCTL, . . . ,43-1KPCTL.

Each driver circuit 43-1A, through 43-1K is in one embodiment capable of no more than 1 milliamp output current; however the current sources 43-1APCTL and 43-1ANCTL through 43-1KPCTL and 43-1KNCTL provided for each driver circuit (such as 43-1A) further limit the output current of the driver circuit (at output 43-1AO) to ten microamps. This beneficially 1) protects the styli from possible electrical damage; 2) increases the protection of the device in case of a system fault; and 3) controls voltage wave shape. The current sources 43-1APCTL, 43-1ANCTL, etc. thus provide the driver circuits 43-1A, . . . ,43-1K with high impedance with regard to the styli 41-1A, . . . ,41-1K (see FIG. 3(a)). This allows waveform control and provides some protection against short circuits between styli.

A voltage level translator (LT) such as 43-1ALT is provided in each driver circuit such as 43-1A to convert the output signals of blanking logic 44-1BL to a voltage level usable by the P-channel FET 43-1AF2. The N-channel FET 43-1AF1 does not require a voltage translator because blanking logic 44-1BL provides the correct voltage for N-channel FET 43-1AF1 to operate.

Various embodiments of the invention having different printhead configurations and including the above described circuitry are described below.

Monoscan Embodiment

One embodiment in accordance with the present invention is a printhead having one row of styli formed on a monolithic substrate, with the IC's (having one driver circuit for each stylus) mounted preferably on the same surface of the substrate. Because the printhead has only one row of styli, it is called a "monoscan" printhead.

Figure 6A:
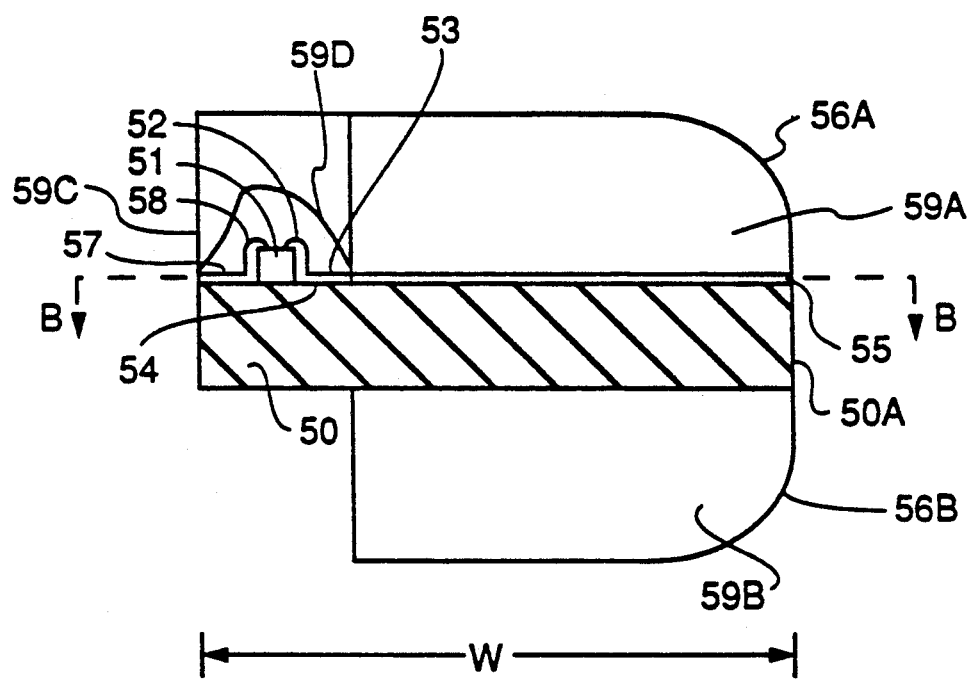
FIG. 6(a) shows a cross-sectional side view of one embodiment of the invention.

As seen in cross-section in a side view in FIG. 6(a), this embodiment includes a substrate 50 on which is mounted a row of IC devices one of which is IC 51. Each of the IC devices such as IC 51 is connected by wires such as wire 52 by connection technologies known in the art such as wire bonding or TAB bonding (not shown) to traces such as trace 53 at bonding pads such as pad 54. Both traces 53 and bonding pads 54 are formed by means well known in the art of printed circuit board manufacturing on substrate 50. The traces such as trace 53 are preferably copper or nickel, typically about 0.002 to 0.010 inch (0.13 mm to 0.25 mm) wide. The trace width and spacing are a function of the printing resolution desired, taking into account such parameters as dot growth, interstylus arcing, etc. Each trace such as trace 53 terminates at one stylus such as 55 which is formed by the end of trace 53 where trace 53 ends at edge 50A of substrate 50. A second set of traces such as 57 on substrate 50 is similarly connected by wire 58 to IC 51. This second set of traces such as trace 57 connects the driver circuits in IC 51 to the input lines as shown in FIG. 6(b) which is a view along line B-B of FIG. 6(a).

Figure 6B:
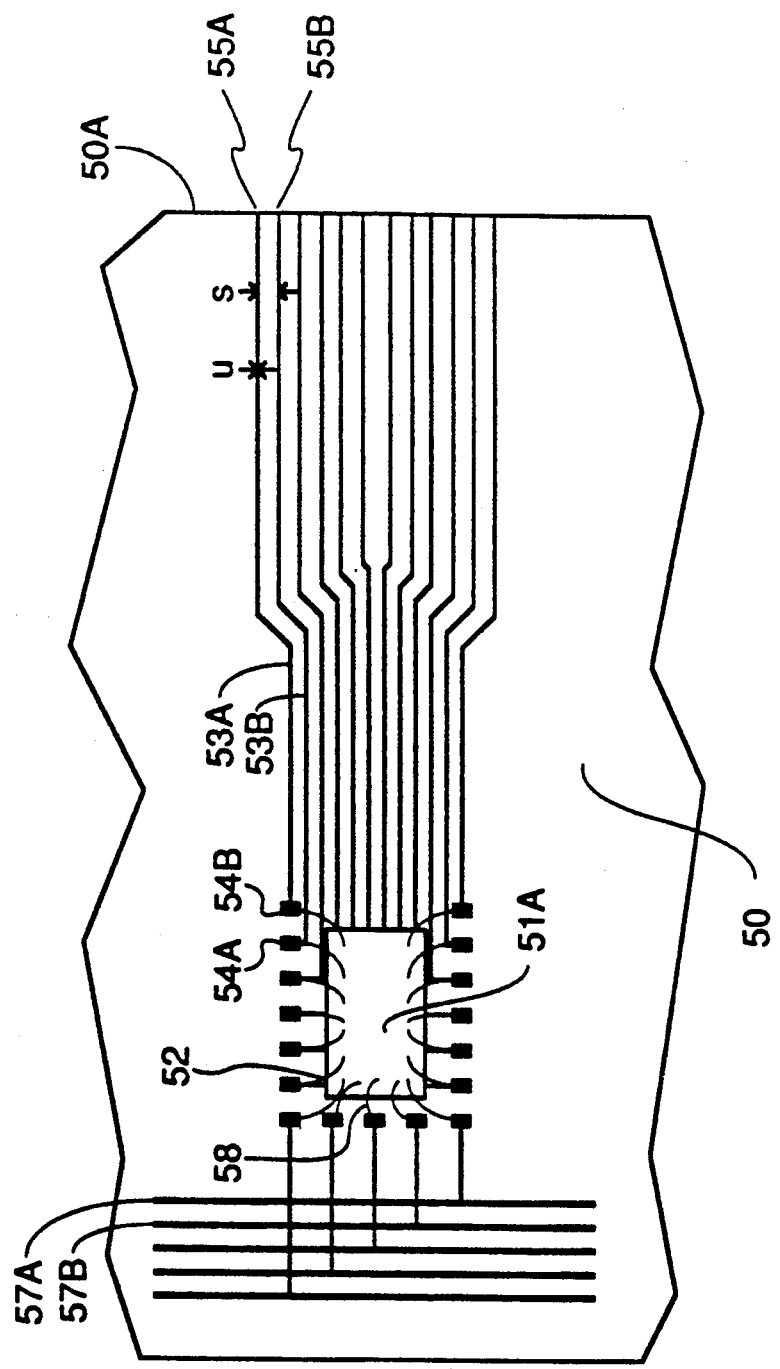
FIG. 6(b) shows a top view of the structure of FIG. 6(a).

Shown in FIG. 6(b) are substrate 50, traces 53A, 53B, etc., bonding pads 54A, 54B, etc., and styli 55A, 55B, etc. as well as input line traces 57A, 57B, etc. and interconnections 52, and 58. As shown in FIG. 6(b) in one embodiment each trace has a width U of 2 mils and a gap S between adjacent traces of 3 mils.

Figure 6C:
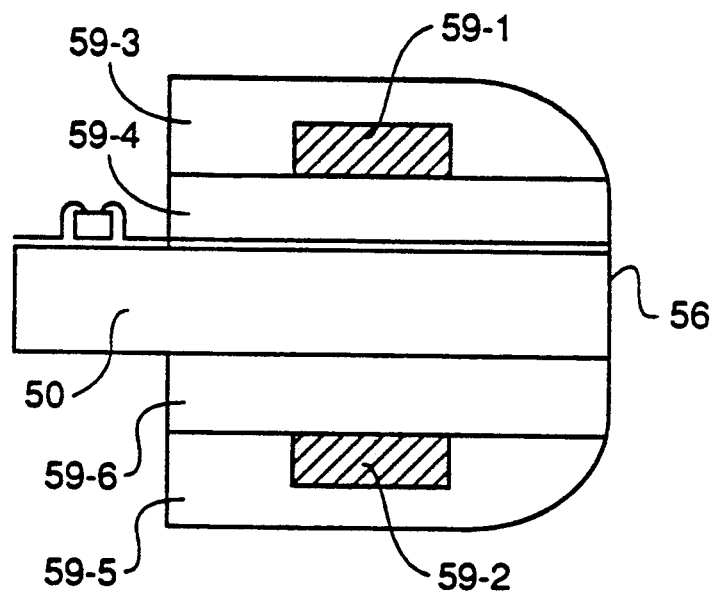
FIG. 6(c) shows a modification of the embodiment of FIG. 6(a).

As shown in FIG. 6(a), substrate 50 has a thickness C of about 0.030 inches (0.8 mm), and a length (not shown) from about 0.08 inch (2 mm) upwards, depending on the width of the image to be printed. Thirty-six inches (900 mm) is a typical length. Substrate 50 typically has a width W of about 3 inches (76 mm). The dimensions of the substrate are a matter of design choice, and not critical to the invention. To provide mechanical stability, substrate 50 is laminated with an adhesive between support plates 59A, 59B, which are pieces of suitable insulating material, such as FR-4, ceramic, or metal with electrical insulation on the side of the metal plate in contact with the printed circuit conductive trace side of substrate 50. In one embodiment, (see FIG. 6(c)) each support plate is respectively a piece of steel 59-1, 59-2 laminated by epoxy and so embedded between two pieces of FR-4 material 59-3, 59-4 and 59-5, 59-6. Each piece of steel 59-1, 59-2 is about 0.250 inch (6.2 mm) thick and the FR-4 pieces 59-3, . . . ,59-6 are each about 0.030 inch (0.8 mm) thick. The edges 56 of the support plates that form the top of the head are preferably curved to allow the media to produce a wrap around the head in actual operation, but they may have any other convenient shape and may be shaped so as to form a flat head, if desired. Similar support plates are used in other embodiments of the invention described below. The complete printhead typically has a total thickness of about 0.25 to 1 inch (0.6 cm to 2.5 cm).

Removable protective cover 59C is provided over the IC's 51. Cover 59C is made of any convenient material, such as plastic. In one embodiment, once assembled and tested, the IC's and traces are conventionally potted with a silicone resin and an overcoat of epoxy resin 59D (see FIG. 6(a)). This potting procedure may also be used in conjunction with the other embodiments described below, in addition to or in place of a cover such as cover 59C.

FIG. 2 shows an isometric view of the monoscan printhead of FIGS. 6(a) and 6(b). Included are substrate 50; IC's 51A, 51B, . . . ,51N; traces 53A, 53B, . . . ,53NK; bonding pads 54A, 54B, . . . ,54NK; styli 55A, 55B, . . . ,55NK; input line traces 57A, 57B, etc.; interconnections 52A, 52B, . . . ,52NK; interconnection 58A, 58B, . . . ,58J; as well as support plate 59B, and dimensions W, C, and L. Upper support plate 59A is not shown, for simplicity.

Biscan Two-sided Embodiment

This embodiment (shown in FIG. 7) is a biscan head with two rows of styli, one row formed on each side of a substrate, and IC's having the driver circuits for the styli on each surface being mounted on that same surface. The substrate, as in the prior art biscan printhead, thus separates the two rows of styli.

Figure 7:
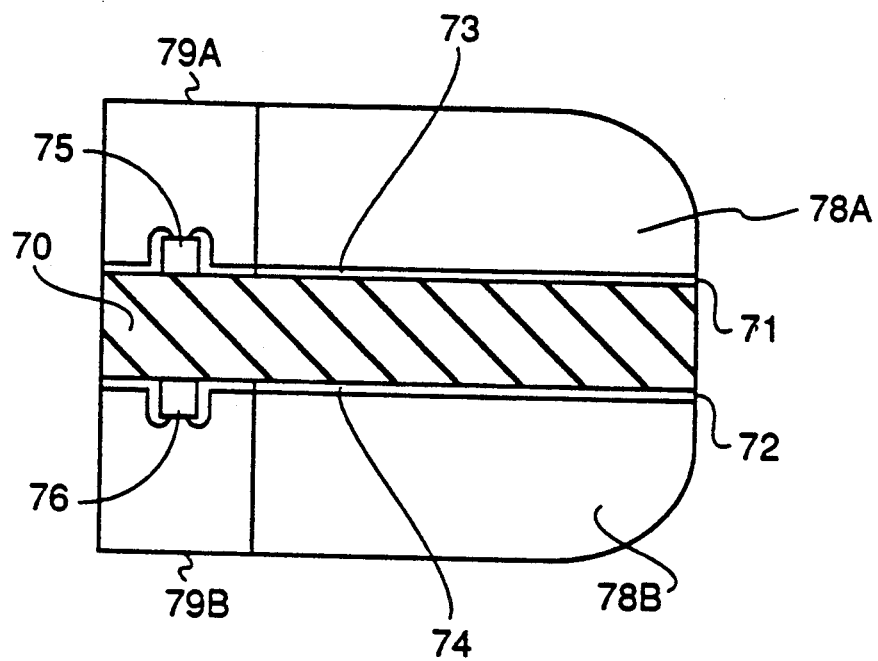
FIG. 7 shows a cross-sectional side view of a second embodiment of the invention.

This embodiment thus has two rows of styli such as 71, 72, one row formed on each side of the substrate 70 as shown in a cross-sectional view from the side in FIG. 7. This embodiment permits wider spacing between adjacent traces and styli and the IC's and so is easier to fabricate than the monoscan printhead since only half the traces such as 73 and half the IC's such as 75 are on one side of the substrate 70. Again, as with the above described monoscan embodiment, substrate 70 is laminated between support plates 78A, 78B to provide mechanical stability. Two covers 79A, 79B are provided for protection. Substrate 70 is of a thickness typically about 0.005 to 0.030 inch (0.13 mm to 0.76 mm.). The styli formed on the two substrate surfaces are a defined distance apart; a preferred defined distance is a multiple of the stylus-to-stylus distance. For a 400 DPI (dots per inch) that distance is 0.0025 inch (0.063 mm). Therefor the distance from the styli of one row to the styli of the other row (or other rows in the case of tri-scan or quad-scan heads) would be a multiple of 0.0025 inches (0.06 mm). This distance should be maintained accurately so that the styli are all a fixed distance apart to a fraction of the stylus-to-stylus distance. For a 400 DPI head this stylus row-to-stylus row distance should be accurate to ±0.0005 inch (0.013 mm) or better. In this embodiment, since the two stylus rows are formed on either side of a single substrate, the alignment of the stylus rows is greatly facilitated. When the stylii are produced photolithographically, for example, the stylus row alignment can be accomplished easily with great precision by aligning the respective artworks and exposing both rows simultaneously.

Biscan Embodiment, Recessed

Figure 8:
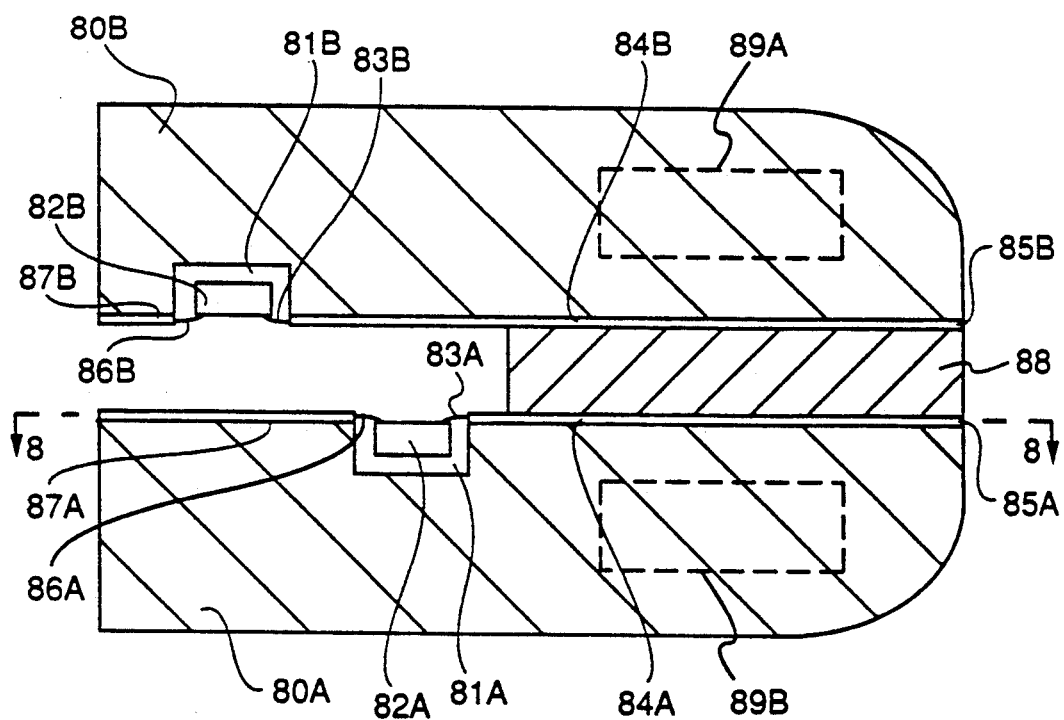
FIG. 8 shows a cross-sectional side view of a third embodiment of the invention.

This embodiment shown in FIG. 8 is a biscan head including two substrates. One row of styli is formed on a surface of the first substrate; the second row of styli are formed on a surface of the second substrate. The IC's associated with each row of styli are located in recesses in the respective substrate surfaces. This allows spacer 87 to be very thin which means that styli row 85A and 85B are close together, reducing the need for buffering electronics. The two substrates are fastened together with the insulating spacer 87 between them, so that the two substrate surfaces with the IC's and styli are approximately co-planar.

This embodiment, as shown in cross-sectional view from the side in FIG. 8, includes two substrates 80A, 80B, each of which as described above typically is printed circuit board material (e.g., FR-4) or a ceramic material or other material In this embodiment the substrates are preferably thicker than in the first two embodiments, preferably 0.12 to 0.25 inch thick (0.3 cm to 0.6 cm). The thick substrates 80A and 80B can in turn be created by laminating thin printed circuit boards to a thicker substrate, similar to the structure shown in FIG. 6(a). Each substrate 80A, 80B has a slot (or recess) 81A, 81B cut into it by well known means such as grinding or milling. The slots are wide enough to accommodate the IC's.

The IC's such as IC's 82A, 82B are placed in the slots 81A, 81B and are bonded by TAB (or wire bonding, not shown) as at 83A, 83B to the traces such as 84A, 84B and also bonded by TAB as at 86A, 86B to the input lines such as 87A, 87B on the substrate 80A and 80B. In one embodiment, each IC such as 82A is suspended in a slot 81A by the TAB bonds 83A, and so does not physically rest on the substrate 80A. Traces such as 84A are formed on the surface of the substrate 80A by conventional etching as described above. The two substrates 80A, 80B are laminated together by an adhesive with an insulating spacer 87 between them. Spacer 87 is, 0.005 to 0.030 inch (0.13 mm to 0.76 mm) thick (or more) and with its thickness accurate to a fraction of the stylus-to-stylus distance, as described above, and is of FR-4, ceramic, or similar material. Spacer 87 must be thicker than the height of the TAB bonds such as 83A, 83B (or wire bonds, not shown) so that the bonds are not crushed when the two substrates 80A, 80B are fixed together. The two rows of styli such as 85A, 85B are the ends of traces such as 84A and 84B. Note that in FIG. 8, IC slots 81A, 81B are offset so as to provide greater clearance for the TAB bonds such as 83A, 83B.

Figure 9:
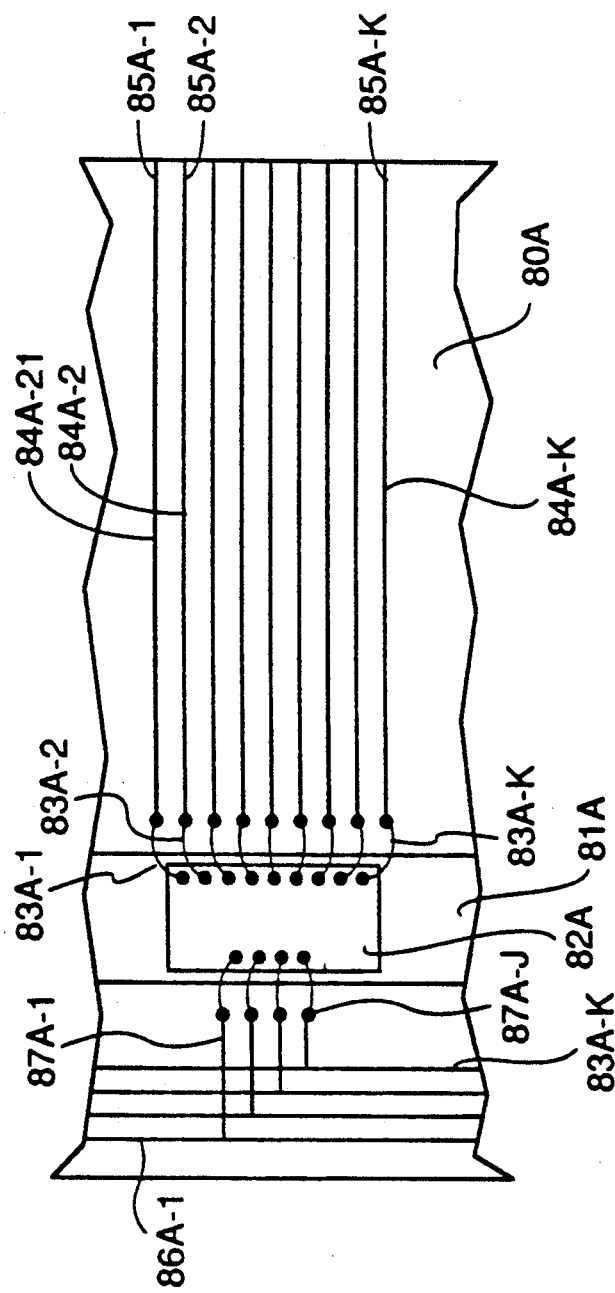
FIG. 9 shows a top view of the structure of FIG. 8.

A partial view through line 8-8 in FIG. 8 is shown in FIG. 9. Shown are substrate 80A; slot 81A; IC 82A; wire bonds 83A-1, 83A-2, . . . , 83A-K; traces 84A-1, 84A-2, . . . , 84A-K; styli 85A-1, 85A-2, . . . , 85A-K; input lines 86A-1, 86A-2, . . . , 86A-J; and pads 87A-1, 87A-2, . . . , 87A-J. IC 82A has a different arrangement of input and output pads than shown in the previous embodiments such as that of FIG. 6(b), since only the sides of IC 82A are accessible for bonding due to the location of the IC's such as IC 82A in the slot 81A. The IC bonding pad layout for the embodiment of FIGS. 8 and 9 is shown in FIG. 5(b).

In this embodiment, since the substrates 80A, 80B are preferably relatively thick, they advantageously also serve as support plates and provide their own dimensional and thermal stability. This stability facilitates the accurate alignment of the stylus rows, which is accomplished mechanically during head assembly.

Biscan Embodiment with Steps

Figure 10:
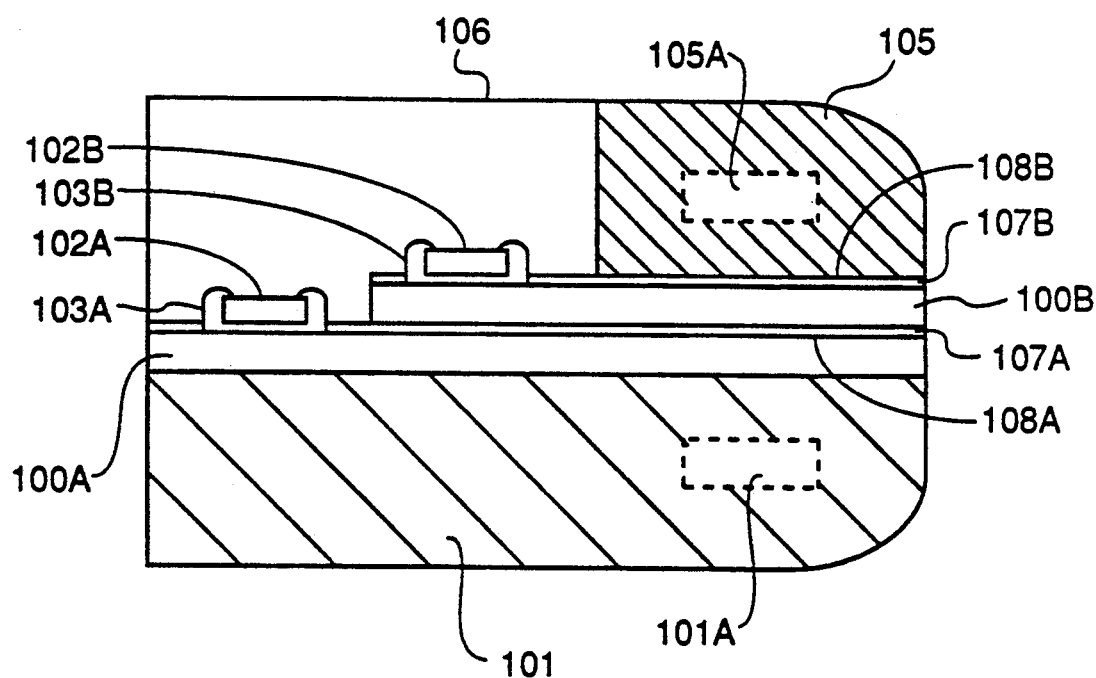
FIGS. 10 through 17 show cross-sectional side views of additional embodiments of the invention.

This embodiment shown in FIG. 10 is a biscan head in which the first row of styli are formed on a first substrate which is fastened to a thick temperature stable support plate, and the IC's associated with those styli are also mounted on the first substrate. A second substrate on which is formed a second row of styli is laminated to the first substrate. The IC's associated with the second row of styli are mounted on the second substrate. The second substrate thus acts as a spacer between the two rows of styli. A thick top plate is then fastened to the second substrate. The thick support plates, one or both made of thick, structural glass epoxy laminate with in one embodiment a buried reinforcement made of steel or similar metal 105A, provides dimensional and thermal stability to the printhead. Such reinforcement can be added to any of the structural side plates in any of the embodiments described herein.

This embodiment is shown in FIG. 10 in a side cross-sectional view, and is fabricated as follows. Styli formed by the ends of the traces, the traces, and input lines to the IC's are formed by well known means on substrates 100A and 100B as in the above described embodiments. Substrate 100A is laminated to a thick bottom plate 101. The IC's such as 102A are TAB or wire bonded such as 103A to the substrate 100A, as described above. Then substrate 100B, typically about 0.005 to 0.030 inch (0.13 mm to 0.76 mm) thick with thickness requirements as described above for the spacer member 87 (FIG. 8), is laminated to a thick top plate, 105. A second row of IC's such as 102B are attached by TAB or wire bonding 103B to the second level substrate 100B. Top and bottom plates 105 and 101 are typically about 0.25 inch (0.6 cm) thick and is made of ceramic, FR-4, electrically insulated steel, or other suitable insulating material The two assemblies are then laminated together. Thus, the thick bottom plate 101 and the thick top plate 105 provide mechanical and thermal stability to the printhead allowing alignment of the stylus rows. In one embodiment steel reinforcements 105A, 101A are buried in respectively top plate 105 and bottom plate 101 to provide further stability.

In an alternate means of fabrication, first substrate 100A is laminated to the thick bottom plate 101, then the traces and pads are formed on substrate 100A. Then the second level substrate 100B is laminated to the top surface of the first substrate 100A, and the traces and IC connect pads are formed on the second level substrate 100B. Thus, the thick bottom plate 101 also provides dimensional stability in terms of thermal expansion during fabrication, so the printed circuitry (i.e., the traces and bonding pads) on the two substrates 100A, 100B is kept in registration during fabrication. Cover 106 is provided. The two rows of styli such as 107A, 107B are at the end of the traces such as 108A, 108B.

Triscan or Quadscan Embodiment with Steps

Figure 11:
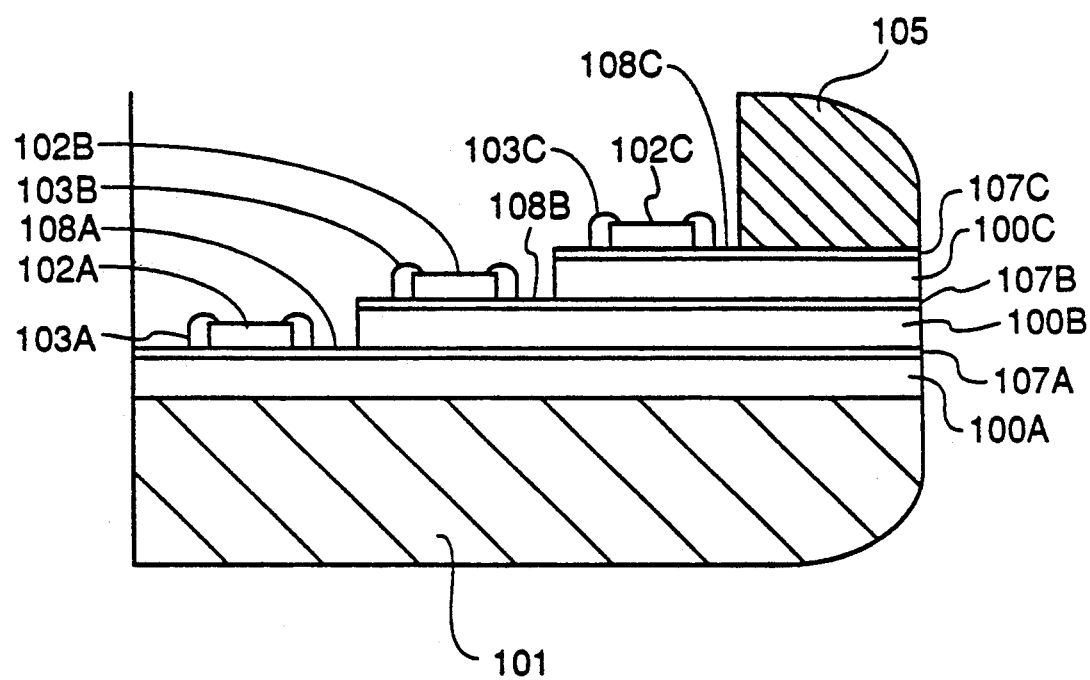

The above-described biscan embodiment with steps is extendable to a triscan printhead having an additional substrate layer consisting (as shown in a side cross-sectional view in FIG. 11) of a third substrate 100C having a third row of styli such as 107C formed on it at the end of traces such as 108C and a row of IC's such as 102C between the second substrate 100B and the thick top plate 105. The embodiment shown in FIG. 11 otherwise is similar to the embodiment shown in FIG. 10. A cover (not shown) is provided over the IC's such as 102A, 102B, 102C as in the previous embodiments. This embodiment has the advantage of further spacing apart both the styli and the IC's and traces, or conversely allowing a higher density of printing.

An additional layer substrate with styli is added to make a quadscan head, or even more layers may be added as desired.

Stepped Embodiment with Multilevel Wire Bonds

An alternative approach to the location of the IC's is used in conjunction with the stepped embodiments described above (i.e., the fourth and fifth embodiments.) In this embodiment, all the IC's are located on the first substrate, and electrically connected to the various rows of styli.

Figure 12:
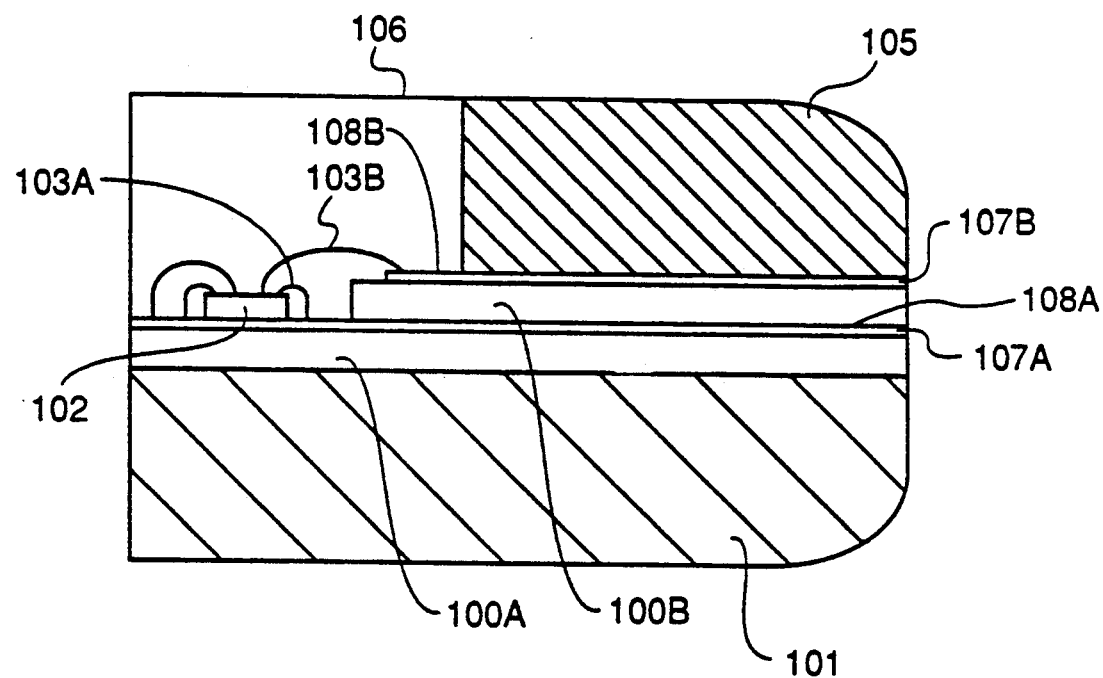

As shown in a cross-sectional view from the side in FIG. 12, in this embodiment only one row of IC's such as IC 102, located on the first substrate 100A, provides the driver circuits for all (two or three or more) levels of substrate 100A, 100B by TAB or wire bonding (such as 103A, 103B) the IC's such as IC 102 to the various traces 108A, 108B on substrates 100A and 100B respectfully. This embodiment simplifies the fabrication process by having the IC's such as 102 all on one level and also reduces the difference between the longest and shortest trace lengths. The other elements shown in FIG. 12 are the same as in FIG. 10. An advantage of this embodiment is a narrower printhead (i.e., shorter traces), thus desirably reducing printhead capacitance.

Additional Biscan Embodiments

Figure 13:
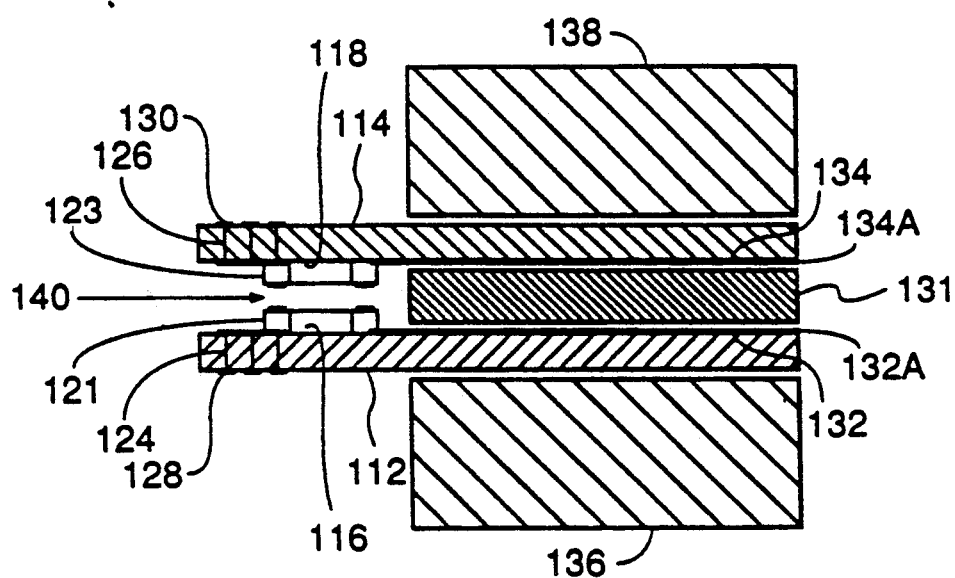

An additional biscan embodiment is shown in FIG. 13. In this embodiment, two substrates are laminated together face-to-face separated by a spacer.

As shown in FIG. 13 in a side cross sectional view, two substrates 112, 114, each of which as described above typically is a printed circuit board or other insulating material, are provided. Each substrate 112, 114, has IC's 116, 118 bonded to one surface respectively by TAB bonds 121, 123. The TAB bonds 121, 123 which connect to the power lines and control lines 128, 130 are connected by holes such as 124, 126 plated respectively though substrates 112, 114 to bonding pads conventionally located around the bonded device. Spacer 131 is bonded to substrate 112 and to substrate 114, over the traces 132, 134 formed on respectively substrate 112 and substrate 114. Spacer 131 is preferably about 0.1 inch (2.5 mm) thick. Substrates 112 and 114 are respectively laminated to support plates 136, 138 as described above. This embodiment has the advantage that the substrate 112, 114 thickness does not determine the spacing between the two rows of styli 132A, 134A formed by the ends of traces 132, 134, because a high accuracy spacer 131 determines this spacing. The gap 140 between the substrates may be filled with epoxy.

Figure 14:
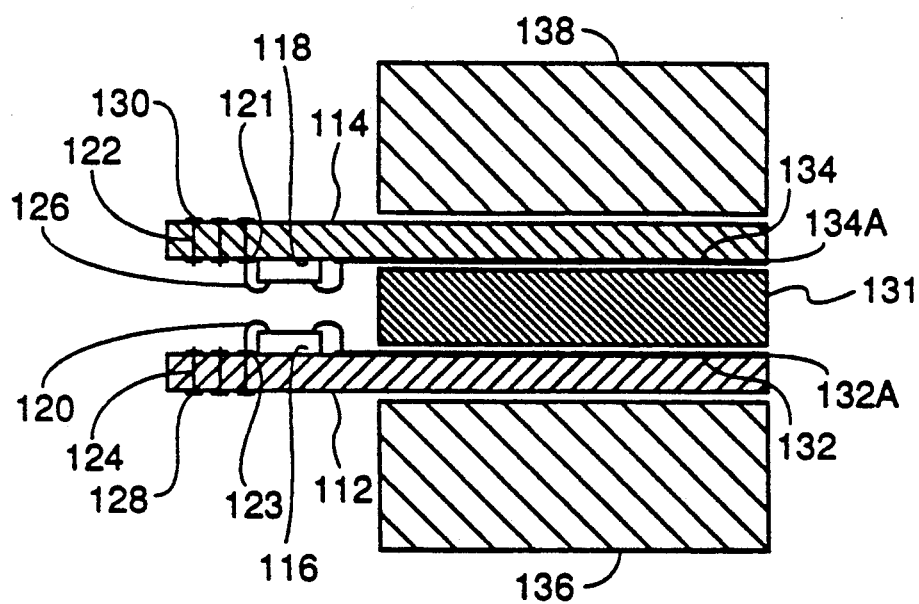

Another biscan embodiment (see FIG. 14) is similar to that of FIG. 13, except that IC's such as 116, 118 are wire bonded 120, 122 to traces 132, 134, control lines 128, 130 and to bonding pads 121, 123 associated with conductively plated holes 124, 126.

Figure 15:
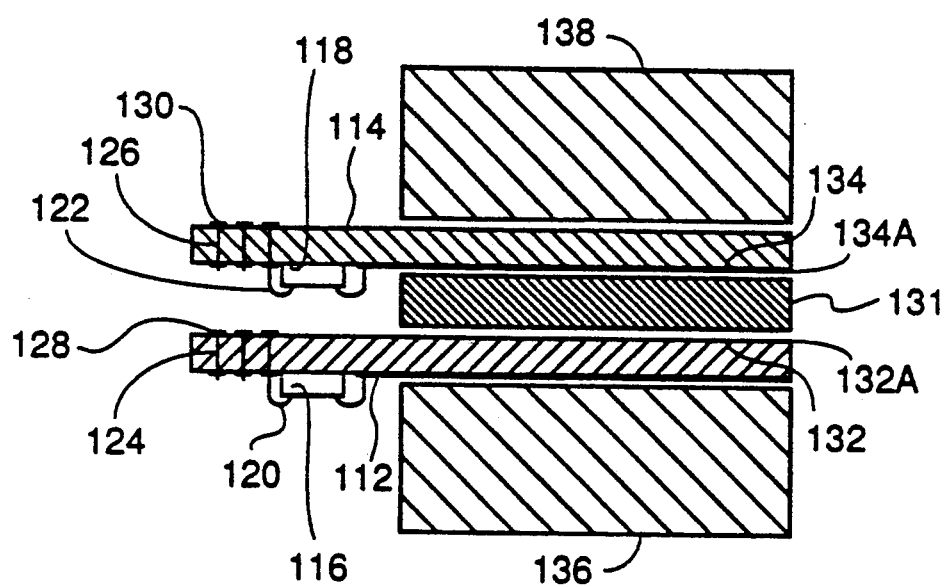

In another biscan embodiment, two substrates are laminated together face-to-back with a spacer between them. This embodiment, as shown in FIG. 15, is otherwise similar to that of FIG. 14, except that spacer 131 is laminated to the surface of substrate 114 on which traces 134 are formed, and to the backside of the second substrate 112. This embodiment has the advantage that the spacer 131 can be one-half the thickness of that of the embodiment of FIG. 14, which reduces the stylus row-to-stylus row distance and thereby reduces the data buffering requirements.

Figure 16:
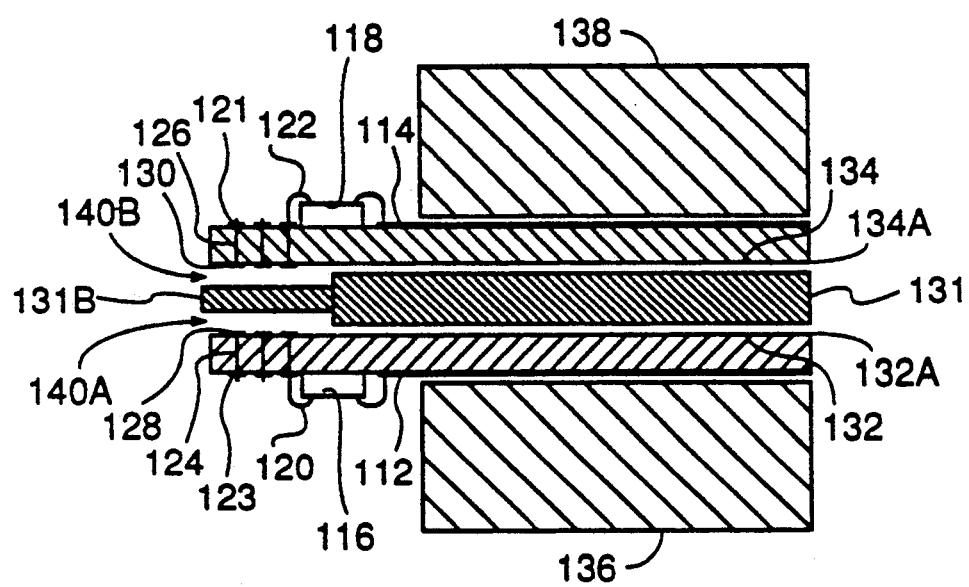

In another biscan embodiment, two substrates are laminated together back-to-back and further separated by a spacer As shown in FIG. 16, substrate 112 has IC's such as 116 attached to its surface by TAB or wire bonding 120. As described above, the bonds 120, 122 bonded to bonding pads 121, 123 are connected by conductively plated holes 124, 126 through respectively substrate 112 and substrate 114 to control lines 128, 130. Spacer 131 is laminated to the back sides of both substrates 112, 114. Support plates 136, 138 are laminated respectively to substrates 112, 114. In this embodiment, spacer 131 includes a thinner portion 131B between the through-plated holes 124, 126. The gaps 140A, 140B are filled with epoxy or similar material.

Figure 17:
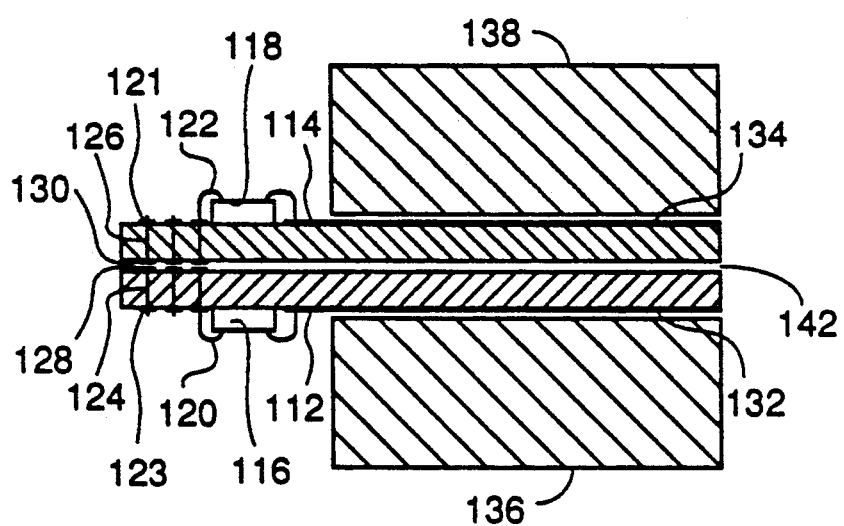

In another biscan embodiment, two substrates are laminated together back-to-back with no spacer between them. As shown in FIG. 17, substrate 112 is laminated to substrate 114. IC's 116, 118 are provided respectively on substrates 112, 114. IC's 116, 118 are TAB or wire bonded 120, 122 to bonding pads 121, 123 on respectively substrates 112, 114. As shown, TAB or wire bonds 120, 122 are connected by conductively plated holes 124, 126 respectively to control lines 128, 130. Support plates 136, 138 are provided as shown.

The above description of the invention is illustrative and not limiting. Other embodiments incorporating the principles of the invention will be apparent to those skilled in the art.

We claim:

1. An electrostatic printhead comprising:
   a plurality of styli for printing, each stylus being an end portion of a conductive trace formed on a substrate and being spaced apart by an air gap from a return path for a current carried by the conductive trace;
   a plurality of driver circuits and associated logic circuitry grouped into at least one integrated circuit die mounted to the substrate, each driver circuit electrically controlling one stylus; and
   electrical interconnections for connecting each driver circuit to one conductive trace.

2. The printhead of claim 1, wherein the integrated circuit die is mounted to the substrate by the electrical interconnections extending from terminals of the die to the traces.

3. The printhead of claim 2, wherein each conductive trace is connected to an associated terminal of the integrated circuit die by a tape automated bond.

4. The printhead of claim 1, wherein all of the styli and all of the integrated circuit die are on one side of the substrate.

5. The printhead of claim 1, further comprising a plurality of integrated circuit die and wherein the substrate has first and second opposing surfaces and wherein the styli are formed in two rows, one row being formed on each of the opposing surfaces, and at least one integrated circuit die is mounted to the first surface and at least one integrated circuit die is mounted to the second surface.

6. The printhead of claim 1 further comprising:
   a second substrate; and
   means for spacing apart the two substrates and to which a surface of the first and a surface of the second substrate are fastened;
   wherein a first portion of the plurality of styli is formed on the first substrate;
   at least one integrated circuit die including a plurality of the driver circuits for driving the styli in the first portion of the styli is on a surface of the first substrate;
   a second portion of the plurality of styli is formed on the second substrate; and at least one integrated circuit die for driving the styli in the second portion of the styli is on a surface of the second substrate.

7. The printhead of claim 6, wherein the surfaces of the first and second substrates on which the styli are formed are the surfaces fastened to the spacer means.

8. The printhead of claim 1, wherein the substrate comprises ceramic material.

9. The printhead of claim 1, wherein the substrate comprises glass-epoxy printed circuit board material.

10. The printhead of claim 1, wherein each trace is connected to a terminal of the integrated circuit die with a wire bond.

11. The printhead of claim 1, wherein each conductive trace is connected to an associated terminal of the integrated circuit die by a tape automated bond.

12. The printhead of claim 1, wherein each conductive trace is one inch or less in length.

13. The printhead of claim 1, wherein each conductive trace is two inches or less in length.

14. The printhead of claim 1, wherein the styli are of substantially uniform width and there is a space between adjacent styli, and the space has a width at least equal to the width of one trace.

15. The printhead of claim 1, wherein each driver is limited to about 1 milliamp current or less.

16. The printhead of claim 1, wherein each driver circuit comprises means for programming the current level provided by the driver by current limiting.

17. The printhead of claim 1, wherein the integrated circuit die includes a serial to parallel data converter for providing a driving signal to each of the plurality of drive circuits from serial input data.

18. An electrostatic printhead comprising:
a plurality of styli for printing, each stylus being an end portion of a conductive trace formed on a first substrate;
a plurality of drivers grouped into at least one integrated circuit die mounted to the first substrate, each driver electrically controlling one stylus;
electrical interconnections for connecting each driver to one conductive trace;
a second substrate;
means for spacing apart the two substrates and to which a surface of the first and a surface of the second substrate are fastened;
wherein a first portion of the plurality of styli is formed on the first substrate;
at least one integrated circuit die for driving the styli in the first portion of the styli is on a surface of the first substrate;
a second portion of the plurality of styli is formed on the second substrate;
at least one integrated circuit die for driving the styli in the second portion of styli is on a surface of the second substrate;
wherein the surfaces of the first and second substrates on which the styli are formed are the surfaces fastened to the means for spacing; and
wherein at least one integrated circuit die is on a recessed portion of the surface of the first substrate.

19. The printhead of claim 1, further comprising means for supporting fastened to the first substrate.

20. The printhead of claim 1, further comprising:
a second substrate having a surface on which a plurality of styli are formed;
a plurality of driver circuits grouped into an integrated circuit die mounted to the second substrate for electrically controlling the plurality of styli on the second substrate, said second substrate; and
means for supporting fastened to the first substrate.

21. An electrostatic printhead comprising:
a plurality of styli for printing, each stylus being an end portion of a conductive trace formed on a substrate;
a plurality of drivers grouped into at least one integrated circuit die mounted to the substrate, each diver electrically controlling one stylus; and
electrical interconnections for connecting each driver to one conductive trace;
a second substrate having a surface on which a plurality of styli are formed;
a plurality of drivers groups into an integrated circuit die mounted to the second substrate for electrically controlling the plurality of styli on the second substrate, said second substrate being fastened in fixed relation to the first substrate;
means for supporting fastened to the first substrate for supporting the substrate; and
a third substrate having a surface on which a plurality of styli are formed, at least one integrated circuit die including drivers being mounted to the third substrate for driving each styli on the third substrate, the third substrate being in fixed relation to the second substrate.

22. An electrostatic printhead comprising:
a plurality of styli for printing, each stylus being an end portion of a conductive trace formed on a substrate;
a plurality of drivers grouped into at least one integrated circuit die mounted to the substrate, each driver electrically controlling one stylus;
electrical interconnections for connecting each driver to one conductive trace; and
a second substrate having a surface on which styli are formed, the second substrate being fastened in fixed relation to the first substrate, wherein the drivers of the integrated circuit die mounted to the first substrate driver the styli on the second substrate.

23. An electrostatic printhead comprising:
a plurality of styli for printing, each stylus being an end portion of a conductive trace formed on a substrate;
a plurality of drivers grouped into at least one integrated circuit die mounted to the substrate, each driver electrically controlling one stylus;
electrical interconnections for connecting each driver to one conductive trace;
means for supporting fastened to the first substrate for supporting the substrate; and
wherein the means for supporting comprises a metal plate embedded in printed circuit board material.

24. An electrostatic printhead comprising:
a plurality of styli for printing, each stylus being an end portion of a conductive trace formed on a substrate;
a plurality of drivers groups into at least one integrated circuit die mounted to the substrate, each diver electrically controlling one stylus; and
electrical interconnections for connecting each driver to one conductive trace;
wherein each of the plurality of drivers comprises at least one P-channel transistor and at least one N-channel transistor thereby providing a complementary driving circuit.

25. A printhead for high voltage electrostatic printing directly onto a permanent medium comprising:
  at least one stylus formed on a substrate for depositing electric charge directly on the permanent medium; and
  at least one driver circuit and associated logic circuitry for driving the stylus with an output current of less than about 10 microamps grouped into at least one integrated circuit die and mounted on the substrate within two inches of an end of the stylus at a printing edge of the substrate, wherein the number of styli and the number of driver circuits are substantially in a one-to-one correspondence.

26. An electrostatic printhead comprising:
  a plurality of styli for printing formed on a substrate; and
  a plurality of driver circuits each electrically connected to one of the styli and grouped into at least one integrated circuit die mounted on the substrate, wherein the integrated circuit die actively drives each stylus to a high voltage and actively drives each stylus to a low voltage at least about 250 volts less than the high voltage.

27. A printhead for high voltage electrostatic printing directly onto a permanent medium comprising:
  a rigid substrate;
  a plurality of styli for electrostatically depositing electric charge directly on the permanent printing medium;
  a plurality of integrated circuit die, each including a plurality of driver circuits and each integrated circuit die being mounted on the substrate, each driver electrically controlling one associated stylus;
  electrical interconnections formed on the substrate for connecting each driver to the associated stylus; and
  a support plate fastened to the substrate.

28. A printhead for high voltage electrostatic printing directly onto a permanent medium comprising:
  a rigid substrate;
  a plurality of styli formed on the substrate for electrostatically depositing electric charge directly on the permanent printing medium, each stylus being substantially wider than it is thick;
  a plurality of integrated circuit die, each including a plurality of driver circuits and each integrated circuit die being mounted on the substrate, each driver electrically controlling one associated stylus; and
  electrical interconnections formed on the substrate for connecting each driver circuit to the associated stylus.

* * * * *